US010381083B1

(12) United States Patent
Yang et al.

(10) Patent No.: US 10,381,083 B1
(45) Date of Patent: Aug. 13, 2019

(54) BIT LINE CONTROL THAT REDUCES SELECT GATE TRANSISTOR DISTURB IN ERASE OPERATIONS

(71) Applicant: SanDisk Technologies LLC, Addison, TX (US)

(72) Inventors: Xiang Yang, Santa Clara, CA (US); Kun-Huan Shih, San Jose, CA (US); Matthias Baenninger, Redmond, WA (US); Huai-Yuan Tseng, San Ramon, CA (US); Dengtao Zhao, Los Gatos, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/018,018

(22) Filed: Jun. 25, 2018

(51) Int. Cl.
| | |
|---|---|
| *G11C 11/34* | (2006.01) |
| *G11C 16/14* | (2006.01) |
| *G11C 16/24* | (2006.01) |
| *G11C 16/30* | (2006.01) |
| *G11C 16/08* | (2006.01) |
| *G11C 16/34* | (2006.01) |
| *H01L 27/1157* | (2017.01) |

(Continued)

(52) U.S. Cl.
CPC .............. *G11C 16/14* (2013.01); *G11C 16/08* (2013.01); *G11C 16/24* (2013.01); *G11C 16/30* (2013.01); *G11C 16/3427* (2013.01); *G11C 16/0483* (2013.01); *G11C 16/3445* (2013.01); *G11C 16/3459* (2013.01); *H01L 27/1157* (2013.01); *H01L 27/11524* (2013.01)

(58) Field of Classification Search
CPC ..... G11C 16/16; G11C 16/14; G11C 16/3445; G11C 16/344; H01L 27/115
USPC ....................................... 365/185.29, 185.18
See application file for complete search history.

(56) References Cited

U.S. PATENT DOCUMENTS

| | | |
|---|---|---|
| 8,891,308 B1 | 11/2014 | Ou et al. |
| 9,019,775 B2 | 4/2015 | Costa et al. |
| 9,136,005 B2 | 9/2015 | Choe et al. |

(Continued)

OTHER PUBLICATIONS

Diep et al., U.S. Appl. No. 15/621,215, filed Jun. 13, 2017, "Channel Pre-Charge to Suppress Disturb of Select Gate Transistors during Erase in Memory," 70 pages.

(Continued)

*Primary Examiner* — Son T Dinh
(74) *Attorney, Agent, or Firm* — Volpe and Koenig, P.C.

(57) ABSTRACT

A memory device and associated techniques avoid a disturb of a select gate transistor during an erase operation for memory cells in a string. During the erase operation, a channel potential gradient near the select gate transistors is reduced when the voltages of the bit line and the substrate are suitably controlled. In one approach, the voltage of the substrate at a source end of the memory string is increased to an intermediate level first before being increased to the erase voltage threshold level while the voltage of the bit line is held at a reference voltage level to delay floating the voltage of the bit line. Another approach builds off the first approach by temporarily decreasing the voltage of the bit line to a negative level before letting the voltage of the bit line to float at the same time as the voltage of the substrate is increased to the erase voltage threshold level.

21 Claims, 17 Drawing Sheets

(51) Int. Cl.
*G11C 16/04* (2006.01)
*H01L 27/11524* (2017.01)

(56) References Cited

U.S. PATENT DOCUMENTS

| | | |
|---|---|---|
| 9,142,305 B2 | 9/2015 | Dunga et al. |
| 9,343,159 B2 | 5/2016 | Dong et al. |
| 9,343,171 B1 | 5/2016 | Sun et al. |
| 9,922,705 B1 | 3/2018 | Diep et al. |
| 9,984,760 B1 | 5/2018 | Zhang et al. |
| 2011/0149659 A1 | 6/2011 | Goda et al. |
| 2012/0033504 A1 | 2/2012 | Sarin et al. |
| 2013/0088918 A1* | 4/2013 | Maejima ............ G11C 16/0483 365/185.11 |
| 2013/0314995 A1 | 11/2013 | Dutta et al. |

OTHER PUBLICATIONS

Shukla et al., U.S. Appl. No. 15/634,006, filed Jun. 27, 2017, "Method and Apparatus for Coupling Up a Voltage-Setting Transistor for a Control Line in a Programming Operation," 58 pages.

Chen et al., U.S. Appl. No. 15/694,008, filed Sep. 1, 2017, "Reducing Hot Electron Injection Type of Read Disturb in 3D Memory Device During Signal Switching Transients," 65 pages.

Diep et al., U.S. Appl. No. 15/621,222, filed Jun. 13, 2017, "Reducing Select Gate Injection Disturb at the Beginning of an Erase Operation," 58 pages.

\* cited by examiner

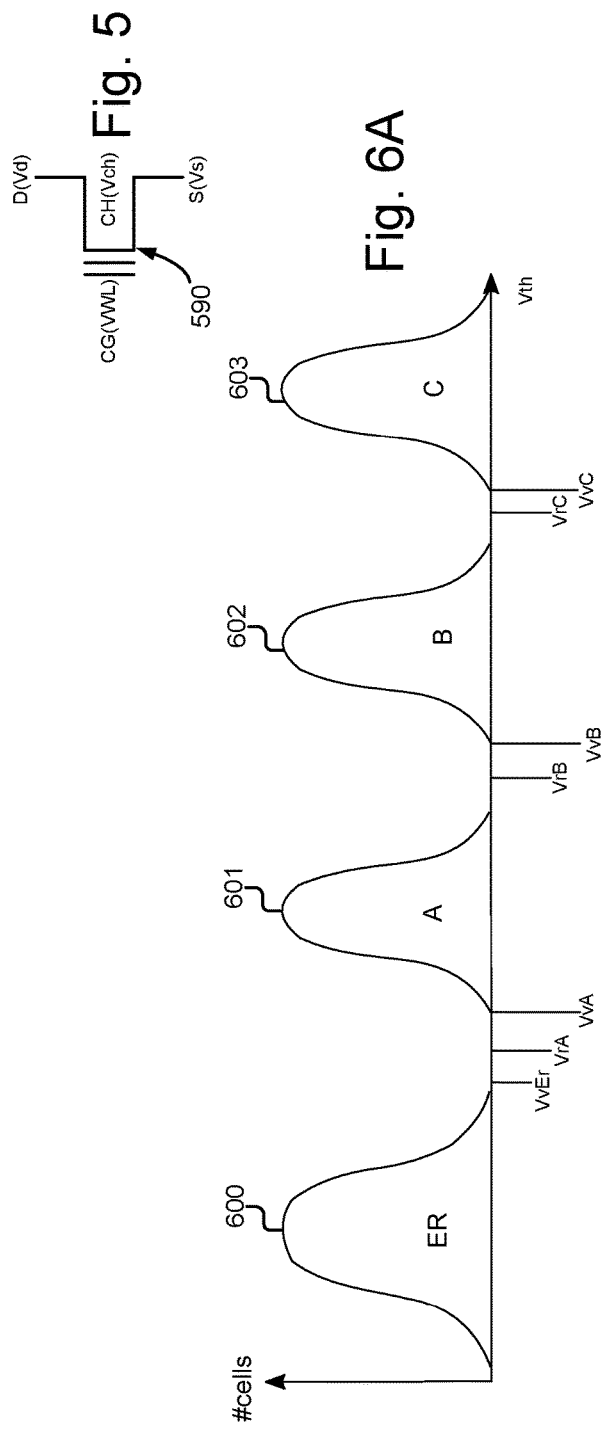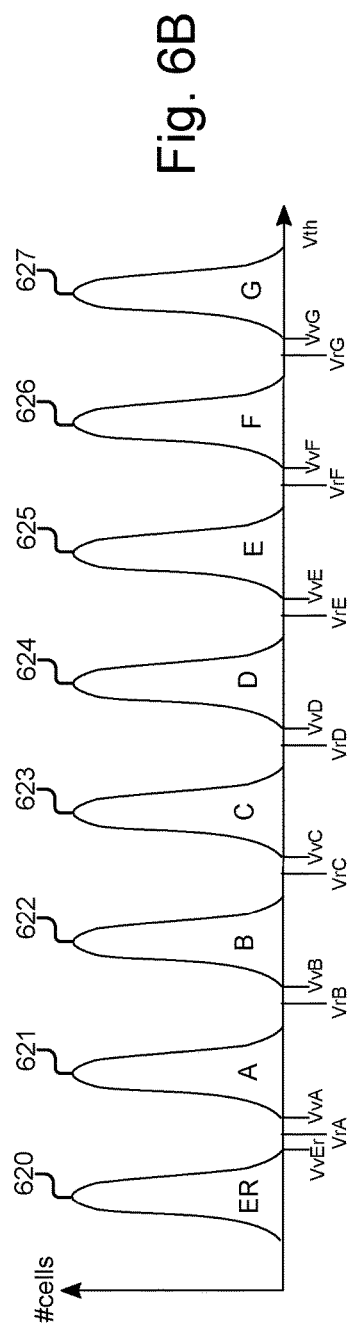

BIT LINE CONTROL THAT REDUCES SELECT GATE TRANSISTOR DISTURB IN ERASE OPERATIONS

TECHNICAL FIELD

The present disclosure pertains generally to operation of memory devices, and more specifically to reducing disturb of select gate transistors in an erase operation.

BACKGROUND

A charge-trapping material such as a floating gate or a charge-trapping material can be used in non-volatile memory devices to store a charge that represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A non-volatile memory device includes memory cells which may be arranged in strings, for instance, where select gate transistors are provided at the ends of the string to selectively connect a channel of the string to a source line or bit line. However, various challenges are present in operating such memory devices. For example, after the memory device is subjected to a number of program-erase cycles, the select gate transistors exhibit unstable threshold voltage distribution, which may lead a memory block in the non-volatile memory device to fail.

It would be desirable to address at least this issue.

SUMMARY

Apparatuses, methods, systems, and/or other aspects are presented for reducing a channel potential gradient near the select gate transistors in an erase operation. One innovative aspect includes an apparatus comprising: a set of memory cells that comprises a memory channel and an erase circuit coupled to the set of memory cells. The memory channel comprises a first end electrically coupled to a bit line, a second end electrically coupled to a substrate, and a select gate between the first end and second end. The erase circuit comprises a bit line driver that is configured to control a voltage of the bit line, and a source line driver that is configured to raise a voltage of the substrate in relation to a change in the voltage of the bit line controlled by the bit line driver, to charge up the memory channel to an erase voltage threshold such that a channel potential gradient of the memory channel between the bit line and the select gate transistor stays below a predetermined threshold when the memory channel charges up.

Some implementations may optionally include one or more of the following features: that the erase circuit further comprises: a disconnect circuit that is configured to disconnect the bit line to float the voltage of the bit line such that the floating voltage of the bit line couples up to the voltage of the substrate, wherein the source line driver is configured to raise the voltage of the substrate to the erase voltage threshold in one or more voltage steps in relation to the floating voltage of the bit line to maintain the channel potential gradient of the memory channel below the predetermined threshold; that the bit line driver is configured to drive the voltage of the bit line up from an initial voltage level in one or more voltage steps toward a voltage level of the substrate; that the source line driver is configured to raise the voltage level of the substrate in one or more voltage steps in relation to a driving of the voltage of the bit line up from the initial voltage level by the bit line driver; that the bit line driver is configured to drive the voltage of the bit line from a first level to a second level; that the second level is lower than the first level; that the source line driver is configured to drive up the voltage of the substrate from a reference voltage level to the erase voltage threshold; that the disconnect circuit is configured to disconnect the bit line to float the voltage of the bit line from the second level; that the bit line driver is configured to drive the voltage of the bit line at a first level; that the first level is a reference voltage level; that the source line driver is configured to drive up the voltage of the substrate from a reference voltage level to an intermediate voltage level at a first time, and to drive up the voltage of the substrate from the intermediate voltage level to the erase voltage threshold at a second time, the second time being later than the first time; that the disconnect circuit is configured to disconnect the bit line to float the voltage of the bit line from the first level at the second time; that the erase circuit further comprises: a word line driver that is configured to hold control gate voltages of the memory cells at a fixed level to erase the memory cells in relation to the charging up of the voltage of the memory channel to the erase voltage threshold; and that the first end is a drain end of the set of memory cells and the second end is a source end of the set of memory cells.

Another general aspect includes an apparatus comprising: an erase circuit coupled to a memory string including a memory channel that is configured to decrease a voltage of a bit line at a drain end of the memory string from a reference voltage level to a negative voltage level, increase a voltage of a substrate at a source end of the memory string from a reference voltage level up to an intermediate voltage level in a first stage and increase the voltage of the substrate from the intermediate voltage level to an erase voltage threshold in a second stage to charge up the memory channel, and float the voltage of the bit line such that the floating voltage of the bit line couples up from the negative voltage level to the voltage of the substrate resulting in a potential gradient in an ungated channel region between the bit line and a select gate transistor at the drain end staying below the erase voltage threshold when the memory channel charges up to the erase voltage threshold.

Some implementations may optionally include one or more of the following features: that the erase circuit is configured to increase the voltage of the substrate from the reference voltage level to the erase voltage threshold in the first stage; and that the erase circuit is configured to hold the voltage of the bit line at the reference voltage level and to float the voltage of the bit line from the reference voltage level.

Another general aspect includes a system comprising: a set of memory cells in a memory string, the memory string including a source end and a drain end, the source end connected to a substrate, the drain end connected to a bit line and a select gate transistor, and a channel including an ungated channel region extending between the select gate transistor and the bit line, and a control circuit coupled to the memory string to reduce a potential gradient in the ungated channel region during an erase operation. The control circuit comprises: a first voltage supply circuit that is configured to step down a voltage of the bit line at the drain end from 0 V to a negative voltage level, a second voltage supply circuit that is configured to increase a voltage of the substrate at the source end from 0 V to an erase voltage threshold to charge up the channel, and a disconnect circuit that is configured to disconnect the bit line in relation to the increase in the voltage of the substrate delivered by the second voltage supply circuit, to float the voltage of the bit line and couples up the floating voltage of the bit line from the negative voltage level to the voltage of the substrate such that the potential gradient in the ungated channel region stays below the erase voltage threshold when the channel charges up to the erase voltage threshold.

Some implementations may optionally include one or more of the following features: that the first voltage supply circuit is configured to step down the voltage of the bit line by about 10 percent of the erase voltage threshold; that the erase voltage threshold has a range between about 18V and about 23V; that the disconnect circuit is configured to float the voltage of the bit line such that the floating voltage of bit line couples up from the negative voltage level to an initial floating voltage level below the erase voltage threshold to reduce the potential gradient in the ungated channel region; and that the disconnect circuit is configured to float the voltage of the bit line such that the floating voltage of the bit line couples up from the initial floating voltage level to the erase voltage threshold.

Another general aspect includes a method comprising: at a first time, increasing a voltage of a substrate at a source end of a memory string from 0 V to an intermediate voltage level, and at a second time, increasing the voltage of the substrate from the intermediate voltage level to an erase voltage threshold, charging up a channel of the memory string to the erase voltage threshold for erasing memory cells based on increasing the voltage of the substrate, the memory string comprising the memory cells between the source end and a drain end, the drain end connected to a bit line and a drain of a select gate transistor, the source end connected to the substrate, and an ungated channel region extending between a contact of the bit line and the drain of the select gate transistor, driving a voltage of the bit line at 0 V, and at the second time, floating the voltage of the bit line from 0 V to couple the floating voltage of the bit line to the voltage of the substrate, the floating voltage rising to a first voltage level such that a voltage difference in the ungated channel region stays below the erase voltage threshold when the channel charges up.

Some implementations may optionally include one or more of the following features: that a voltage of the intermediate voltage level has a range between about 10 percent and about 50 percent of the erase voltage threshold; and that a value of the first voltage level is a difference between the erase voltage threshold and the intermediate voltage level.

Another general aspect includes an apparatus comprising: a memory string comprising a set of memory cells and a memory channel between a source end and a drain end, the drain end connected to a select gate transistor and a bit line, and the source end connected to a substrate, means for driving a voltage of the bit line at the drain end, means for increasing a voltage of the substrate at the source end in one or more voltage steps to charge up the memory channel to an erase voltage threshold, and means for floating the voltage of the bit line in relation to increasing the voltage of the substrate to couple up the floating voltage of the bit line to the voltage of the substrate such that a potential gradient between the bit line and the select gate transistor in the memory channel stays below the erase voltage threshold when the memory channel charges up.

Note that the above list of features is not all-inclusive, and many additional features and advantages are contemplated and fall within the scope of the present disclosure. Moreover, the language used in the present disclosure has been principally selected for readability and instructional purposes, and not to limit the scope of the subject matter disclosed herein.

BRIEF DESCRIPTION OF THE DRAWINGS

FIG. 5 depicts an example memory cell.
FIG. 6A depicts an example threshold voltage (Vth) distribution of a set of memory cells in which four data states are used.
FIG. 6B depicts an example Vth distribution of a set of memory cells in which eight data states are used.

The Figures depict various embodiments for purposes of illustration only. It should be understood that alternative embodiments of the structures and methods illustrated herein may be employed without departing from the principles described herein.

DETAILED DESCRIPTION

Innovative technology, including various aspects such as apparatuses, processes, methods, systems, etc., is described for reducing disturb of select gate transistors in an erase operation for a block of memory cells. In the following description, for purposes of explanation, numerous specific details are set forth to provide a thorough understanding of the various aspects of different example embodiments. Note that any particular example embodiment may in various cases be practiced without all of the specific details and/or with variations, permutations, and combinations of the various features and elements described herein.

As described in detail below, in some memory devices, the memory cells are joined to one another such as in NAND strings in a block or sub-block. Each NAND string includes a number of memory cells connected in series between one or more drain-side select gate transistors (SGD transistors), on a drain-side of the NAND string which is connected to a bit line, and one or more source-side select gate transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 7:
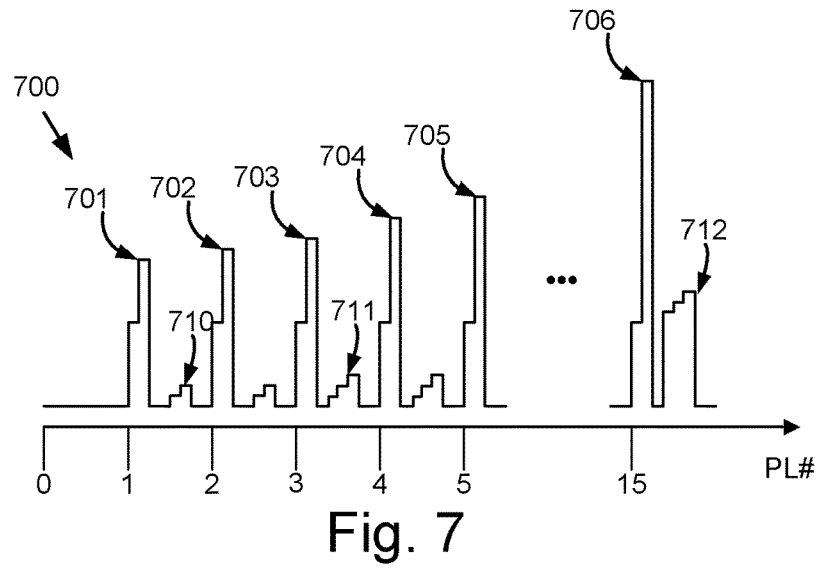
FIG. 7 depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 7. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data associated with a program command. Generally, a memory device includes memory cells which store words of user data as code words. Each code word includes symbols, and each data state represents one of the symbols. When a cell stores n bits of data, the symbols can have one of $2^n$ possible values. The data states include an erased state and one or more programmed states. A programmed state is a data state to which a memory cell is to be programmed in a programming operation. The symbol or data state which is to be represented by a cell is identified by one or more bits of write data in latches associated with the memory cell. This data state is the assigned data state. Each data state corresponds to a different range of threshold voltages (Vth). Moreover, a programmed state is a state which is reached by programming a memory cell so that its Vth increases from the Vth range of the erased state to a higher Vth range. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 6A). In a three-bit per cell memory device, there are eight data states including the erased state and seven higher data states referred to as the A, B, C, D, E, F and G data states (see FIG. 6B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. Erasing the block involves boosting the channel voltage (Vch) while holding the control gates of the memory cells in the block at a low voltage, for example, 0-0.5 V. Various approaches can be used to boost the channel voltage. One approach raises the voltage of a substrate (CPWELL) at a source end of the memory strings. In one embodiment, the control gate voltage of a source side select gate transistor (SGS transistor) of each memory string is additionally controlled to allow holes (positive charges) to enter the channel. The substrate is the primary source of holes. The conduction of holes from the substrate charges up the channel and boosts the channel voltage. In another approach, a voltage can also be applied to the drain ends of the memory strings via bit lines, to help boost the channel voltage.

However, during a conventional erase operation, the substrate voltage, which is supplied by an upper metal layer (e.g., M2 layer) patterned in a conductive path, increases more slowly due to the large capacitance of the substrate. Moreover, it takes some time for the drain end of the channel (e.g., top of the channel) to be charged up by the holes which are passed from the substrate into the source end of the channel. On the other hand, the voltage on the bit line, which is supplied by a lower metal layer (e.g., M1 layer) patterned in a conductive path, typically increases to the requested level (e.g., an erase voltage threshold) quickly due to corresponding low resistance. Also, M1 layer, which is below M2 layer, is capacitively coupled to the M2 layer. When the voltage of the bit line floats, this M1-M2 capacitive coupling allows the floating voltage of the bit line to quickly couple up to whatever voltage is supplied via the M2 layer. For example, the voltage of the bit line may increase to the erase voltage threshold applied to the substrate before the top of the channel. As a result, a channel potential gradient can be generated near the SGD transistors. For example, the channel potential gradient can be generated between the bit line contact and the SGD transistors in the string. If large enough, the channel potential gradient can generate electron-hole pairs in which the electrons are drawn (e.g., by hot electron injection) into the charge trapping layer near the SGD transistors, raising the threshold voltage of these transistors. E.g., see FIG. 9. This is a type of injection disturb that is unrecoverable because the injected electrons become permanently trapped and cannot be removed by program or erase operation. This is because the spacing between the bit line contact and the SGD transistors is ungated.

In some cases, the disturb of SGD transistors worsens after a number of program-erase cycles which leads to issues during a read or program operation. For example, the increase in critical threshold voltages of the SGD transistors may result in the SGD transistors failing to switch into a conductive state in response to a typical bias voltage applied to the control gates of the SGD transistors. This may cut off the memory string and cause program loop to shoot-up and fail the memory block. In some cases, the disturb of SGD transistors may also be worsened by the usage of larger erase voltage thresholds for erasing the block in the memory device.

Techniques provided herein address the above and other issues. In one aspect, a channel potential gradient near the SGD transistors is reduced by controlling the voltages of the bit line and the substrate during an erase iteration. One approach involves applying a voltage at an intermediate voltage level to the substrate at the source ends of the memory strings while the voltage of the bit line is held at a reference voltage level (e.g., zero volts) to delay floating of the bit line voltage, before increasing the voltage from the intermediate voltage level to an erase voltage threshold when the voltage of the bit line floats. The voltage at the intermediate voltage level helps charge up the channel to a positive level before the voltage at the substrate is increased to the erase voltage threshold. Another approach involves driving the bit line voltage at a negative level and then letting the bit line voltage to float at a higher level when the voltage of the substrate is increased to the erase voltage threshold.

The techniques may be adjusted depending on whether the word lines are at a positive floating voltage at a start of the erase operation and based on a level of the floating voltage. In one embodiment, the disturb countermeasures are performed not only for the first erase-verify iteration in an erase operation but also for subsequent erase-verify iterations in the erase operation.

Various other features and benefits are described below.

Figure 1:
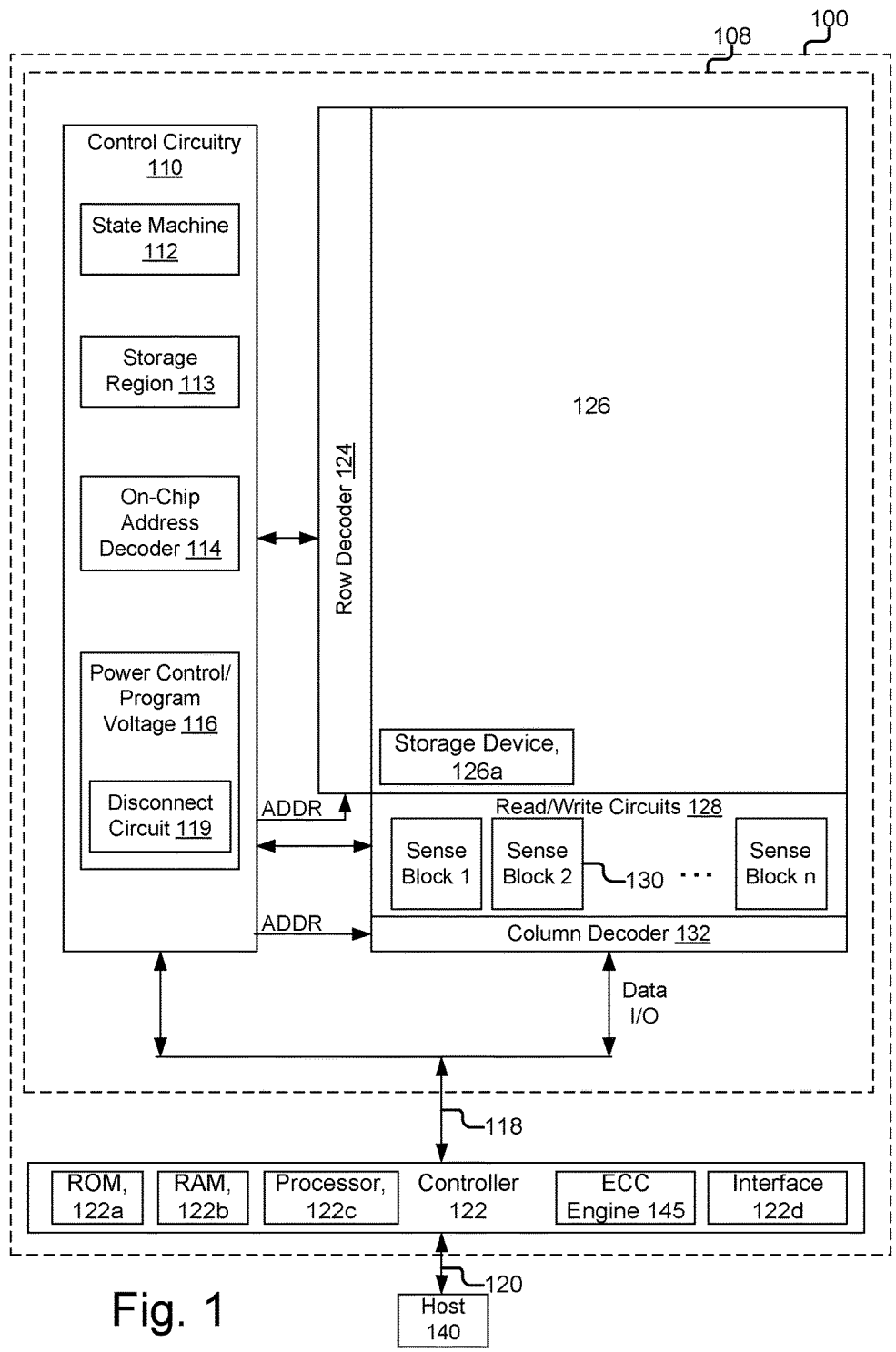
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 130 from 1, 2, . . . , n (sensing circuitry) and allow a page of memory cells to be read or programmed in parallel. Typically, a controller 122 is included in the same memory device 100 (e.g., a removable storage card) as the one or more memory die 108. The controller 122 may be separate from the memory die 108. Commands and data are transferred between the host 140 and controller 122 via a data bus 120, and between the controller 122 and the one or more memory die 108 via lines 118.

The memory structure 126 can be multidimensional (e.g., 2D or 3D). The memory structure 126 may include one or more array of memory cells including a 3D array. The memory structure 126 may include a monolithic 3D memory structure in which multiple memory levels are formed above (and not in) a single substrate, such as a wafer, with no intervening substrates. The memory structure 126 may include any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

In some embodiments, the memory structure 126 may comprise a set of memory cells comprising a memory channel. The memory channel may comprise a first end electrically coupled to a bit line, a second end electrically coupled to a substrate, and a select gate between the first end and second end. In some cases, the first end is a drain end of the set of memory cells and the second end is a source end of the set of memory cells. In some embodiments, the set of memory cells may comprise a memory string that has a source end, a drain end, and a channel. The source end may be connected to a substrate, and the drain end may be connected to a bit line and a select gate transistor. The channel may include an ungated channel region extending between the select gate transistor and the bit line.

The control circuitry 110 cooperates with the read/write circuits 128 to perform memory operations on the memory structure 126. The control circuitry 110 includes a state machine 112, a storage region 113, an on-chip address decoder 114, and a power control/program voltage module 116 including a disconnect circuit 119. The state machine 112 provides chip-level control of memory operations. The storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host 140 or a memory controller 122 to the hardware address used by the decoders 124 and 132. The power control module 116 controls the power and voltages supplied to the word lines, select gate lines, bit lines, source lines and substrate during memory operations. It can include drivers for word lines, bit lines, SGS and SGD transistors and source lines.

In some embodiments, the power control module 116 may comprise various sub-components for controlling various elements of the memory structure 126, such as, but not limited to, a bit line driver configured to control the voltages of the bit lines; a source line driver configured to control the voltage of the substrate; a word line driver configured to control the voltages associated with the word lines, control gate voltages, etc., etc. It should be understood, however, that these sub-components may be combined into other components of the control circuitry, or may be implemented as separate components included in the control circuitry that are configured to carry out the same or similar functionality and acts as the power control module 116 described herein.

In some instances, the power control module 116 may embody an erase circuit configured to perform erase operations at various intervals.

In some embodiments, the erase circuit may include the bit line driver, source line driver, disconnect circuit, word line driver, and/or other components, and may control the word lines, bit lines, SGS and SGD transistors and source lines during an erase operation. The source line driver may be configured to raise a voltage of the substrate in relation to a change in the voltage of the bit line controlled by the bit line driver, which charges up the memory channel to an erase voltage threshold. The charging of the memory channel may be done is such a way that a channel potential gradient of the memory channel between the bit line and the select gate transistor stays below a predetermined threshold when the memory channel charges up. Stated another way, the timing of the change in the voltage of the substrate and the voltage of the bit line as controlled by the power control module 116 may control the charging of the memory channel in such a way that the channel potential gradient is maintained (e.g., on average, strictly, etc.) below a level where significant electron injection occurs.

The raising of the voltage in relation to the change in the voltage of the bit line charges up the memory channel to an erase voltage threshold in a way where the channel potential gradient of the memory channel between the bit line and the select gate transistor stays below a predetermined threshold when the memory channel charges up. Keeping the gradient substantially below the threshold (e.g., 90% or better) is advantageous as the predetermined threshold may represent a level where electrons become injected into an upper region of the memory structure 126 and cause erase or programming issues, as discussed in further detail below. It should be understood that the predetermined threshold may be different for different memory structure 126 types, and may vary/be configurable depending on the implementation.

In some embodiments, the erase circuit may be coupled to a memory string comprising a memory channel, and may be configured to control the charging of the memory channel by controlling the voltage of the bit line and the substrate. For instance, the erase circuit may decrease a voltage of a bit line at a drain end of the memory string from a reference voltage level to a negative voltage level; increase a voltage of a substrate at a source end of the memory string from a reference voltage level up to an intermediate voltage level in a first stage and increase the voltage of the substrate from the intermediate voltage level to an erase voltage threshold in a second stage to charge up the memory channel; and float the voltage of the bit line such that the floating voltage of the bit line couples up from the negative voltage level to the voltage of the substrate resulting in a potential gradient in an ungated channel region between the bit line and a select gate transistor at the drain end staying below the erase voltage threshold when the memory channel charges up to the erase voltage threshold, as described further elsewhere herein. In some cases, the erase circuit is configured to increase the voltage of the substrate from the reference voltage level to the erase voltage threshold in the first stage, and/or is configured to hold the voltage of the bit line at the reference voltage level and to float the voltage of the bit line from the reference voltage level.

In some embodiments, the bit line driver may comprise and/or be coupled to the disconnect circuit 119, which may be configured to (e.g., responsive to receiving an instruction from the bit line driver or the power control module 116) disconnect a bit line to float the voltage of the bit line such that the floating voltage of the bit line couples up to the voltage of the substrate. In this example, the source line driver may be configured to raise the voltage of the substrate to the erase voltage threshold in one or more voltage steps in relation to the floating voltage of the bit line to maintain the channel potential gradient of the memory channel below the predetermined threshold.

In some further embodiments, the bit line driver may be configured to drive the voltage of the bit line from a first level to a second level, where the second level is lower than the first level, and/or the source line driver may be configured to drive up the voltage of the substrate from a reference voltage level to the erase voltage threshold. In these embodiments, the disconnect circuit may be configured to disconnect the bit line to float the voltage of the bit line from the second level.

In some further embodiments, the bit line driver may be configured to drive the voltage of the bit line at a first level, where the first level is a reference voltage level. In these embodiments, the source line driver may be configured to drive up the voltage of the substrate from a reference voltage level to an intermediate voltage level at a first time, and to drive up the voltage of the substrate from the intermediate voltage level to the erase voltage threshold at a second time, the second time being later than the first time. The disconnect circuit may be configured to disconnect the bit line to float the voltage of the bit line from the first level at the second time.

In some further embodiments, a word line driver may be configured to hold control gate voltages of the memory cells at a fixed level to erase the memory cells in relation to the charging up of the voltage of the memory channel to the erase voltage threshold.

In some other embodiments, the power control module 116 may drive the bit line prior to and/or alternatively to floating the bit line. For example, the bit line driver may be configured to drive the voltage of the bit line up from an initial voltage level in one or more voltage steps toward a voltage level of the substrate, and the source line driver may be configured to raise a voltage of the substrate in relation to a change in the voltage of the bit line controlled by the bit line driver to maintain the channel potential gradient of the memory channel below the predetermined threshold. Other embodiments are also possible and contemplated.

The sense blocks 130 can include bit line drivers, in one approach. An SGS transistor is a select gate transistor at a source end or source side of a NAND string, and an SGD transistor is a select gate transistor at a drain-end or drain side of a NAND string. In one embodiment, the power control module 116 includes disconnect circuit 119. The disconnect circuit 119 can be used to disconnect the bit line of a memory string from a driven voltage so that the voltage of the bit line floats and couples to the voltage of the substrate. In one embodiment, the power control module 116 including the disconnect circuit 119 can be used to implement the techniques described herein including the processes of FIG. 11 to 12.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114, 124 and 132, power control/program voltage module 116, disconnect circuit 119, sense blocks 130, read/write circuits 128, controller 122, and so forth.

The controller 122 (which in one embodiment is an electrical circuit and may in some cases be an off-chip controller) may comprise a processor 122c, storage devices (memory) such as ROM 122*a* and RAM 122*b* and an error-correction code (ECC) engine 145. The ECC engine 145 can correct a number of read errors.

A memory interface 122*d* may also be provided. The memory interface 122*d*, in communication with ROM 122*a*, RAM 122*b*, and processor 122*c*, is an electrical circuit that provides an electrical interface between controller 122 and memory die 108. For example, the memory interface 122*d* can change the format or timing of signals, provide a buffer, isolate from surges, latch I/O and so forth. The processor 122*c* can issue commands to the control circuitry 110 (or any other component of the memory die 108) via the memory interface 122*d*.

A storage device 126*a* of the memory structure 126 includes code such as a set of instructions, and the processor 122*c* is operable to execute the set of instructions to provide the functionality described herein. Alternatively or additionally, the processor 122*c* can access code from the storage device 126*a* of the memory structure 126, such as a reserved area of memory cells in one or more word lines.

For example, code can be used by the controller 122 to access the memory structure 126, such as for programming, read and erase operations. The code can include boot code and control code (e.g., a set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host 140 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host 140 may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It should be understood that this technology is not limited to the 2D and 3D exemplary structures described but covers all relevant memory structures within the spirit and scope of the technology as described herein.

Figure 2:
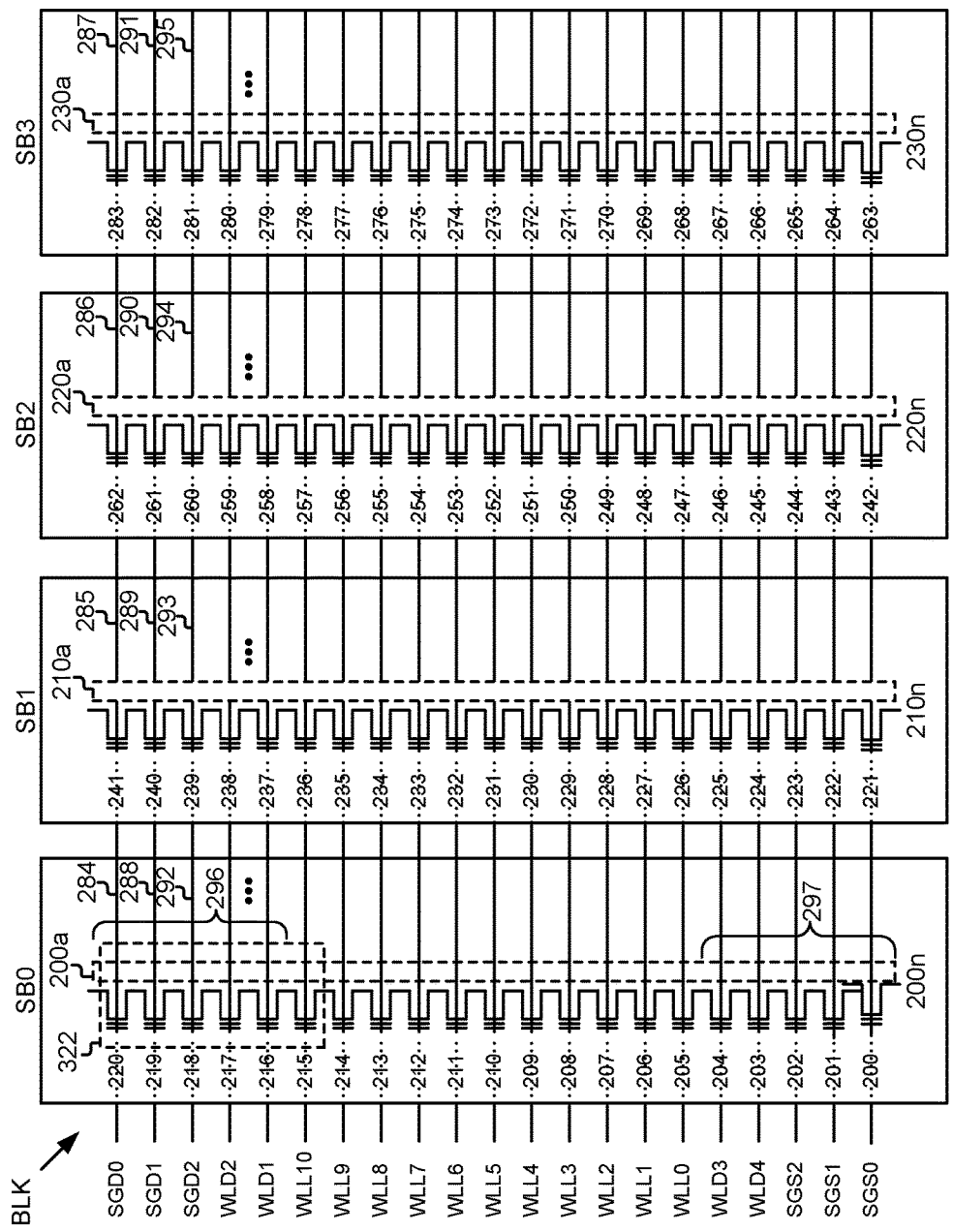
FIG. 2 depicts an example implementation of a memory structure of FIG. 1.

FIG. 2 depicts an example implementation of the memory structure 126 of FIG. 1 including NAND strings in sub-blocks in a 3D configuration. In one approach, a block BLK of memory cells is formed from a stack of alternating conductive and dielectric layers. The block includes conductive layers spaced apart vertically, and the conductive layers spaced apart vertically include word lines connected to the memory cells and select gate lines connected to SGD (drain-side select gate) and SGS (source-side select gate) transistors. In this example, the conductive layers include three SGD layers, three SGS layers and four dummy word line layers (or word lines) WLD1, WLD2, WLD3 and WLD4, in addition to data word line layers (or word lines) WLL0-WLL10. Although not shown, the dielectric layers include DL0-DL21. Each NAND string may be formed in a memory hole in the stack filled with materials which form memory cells adjacent to the word lines. A region 322 of the stack is shown in greater detail in FIG. 3.

Further, each block can be divided into sub-blocks and each sub-block includes multiple NAND strings, where one example NAND string is depicted. For example, sub-blocks SB0, SB1, SB2 and SB3 comprise example NAND strings 200n, 210n, 220n and 230n, respectively. The NAND strings have data word lines, dummy word lines, and select gate lines. Each sub-block includes a set of NAND strings which extend in the x direction and which have a common SGD line. SB0 has SGD lines or SGD layer portions 284, 288, and 292 in the SGD0, SGD1, and SGD2 layers, respectively. SB1 has SGD layer portions 285, 289, and 293 in the SGD0, SGD1, and SGD2 layers, respectively. SB2 has SGD layer portions 286, 290, and 294 in the SGD0, SGD1, and SGD2 layers, respectively. SB3 has SGD layer portions 287, 291, and 295 in the SGD0, SGD1, and SGD2 layers, respectively. Each of the data word line layers WLL0 to WLL10 and the SGS layers SGS0, SGS1, and SGS2 is shared by the sub-blocks SB0 to SB3. The dummy word line layers are also shared by the sub-blocks.

The NAND strings 200n, 210n, 220n and 230n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 200n, 210n, 220n and 230n have channels 200a, 210a, 220a and 230a, respectively. Each channel has a drain end and a source end. For example, the channel 200a has a drain end 296 and a source end 297.

Additionally, NAND string 200n includes SGS transistors 200, 201, and 202, dummy memory cells 203 and 204, data memory cells 205, 206, 207, 208, 209, 210, 211, 212, 213, 214 and 215, dummy memory cells 216 and 217, and SGD transistors 218, 219, and 220.

NAND string 210n includes SGS transistors 221, 222, and 223, dummy memory cells 224 and 225, data memory cells 226, 227, 228, 229, 230, 231, 232, 233, 234, 235, and 236, dummy memory cells 237 and 238, and SGD transistors 239, 240, and 241.

NAND string 220n includes SGS transistors 242, 243, and 244, dummy memory cells 245 and 246, data memory cells 247, 248, 249, 250, 251, 252, 253, 254, 255, 256, and 257, dummy memory cells 258 and 259, and SGD transistors 260, 261, and 262.

NAND string 230n includes SGS transistors 263, 264, and 265, dummy memory cells 266 and 267, data memory cells 268, 269, 270, 271, 272, 273, 274, 275, 276, 277, and 278, dummy memory cells 279 and 280, and SGD transistors 281, 282, and 283.

Figure 3:
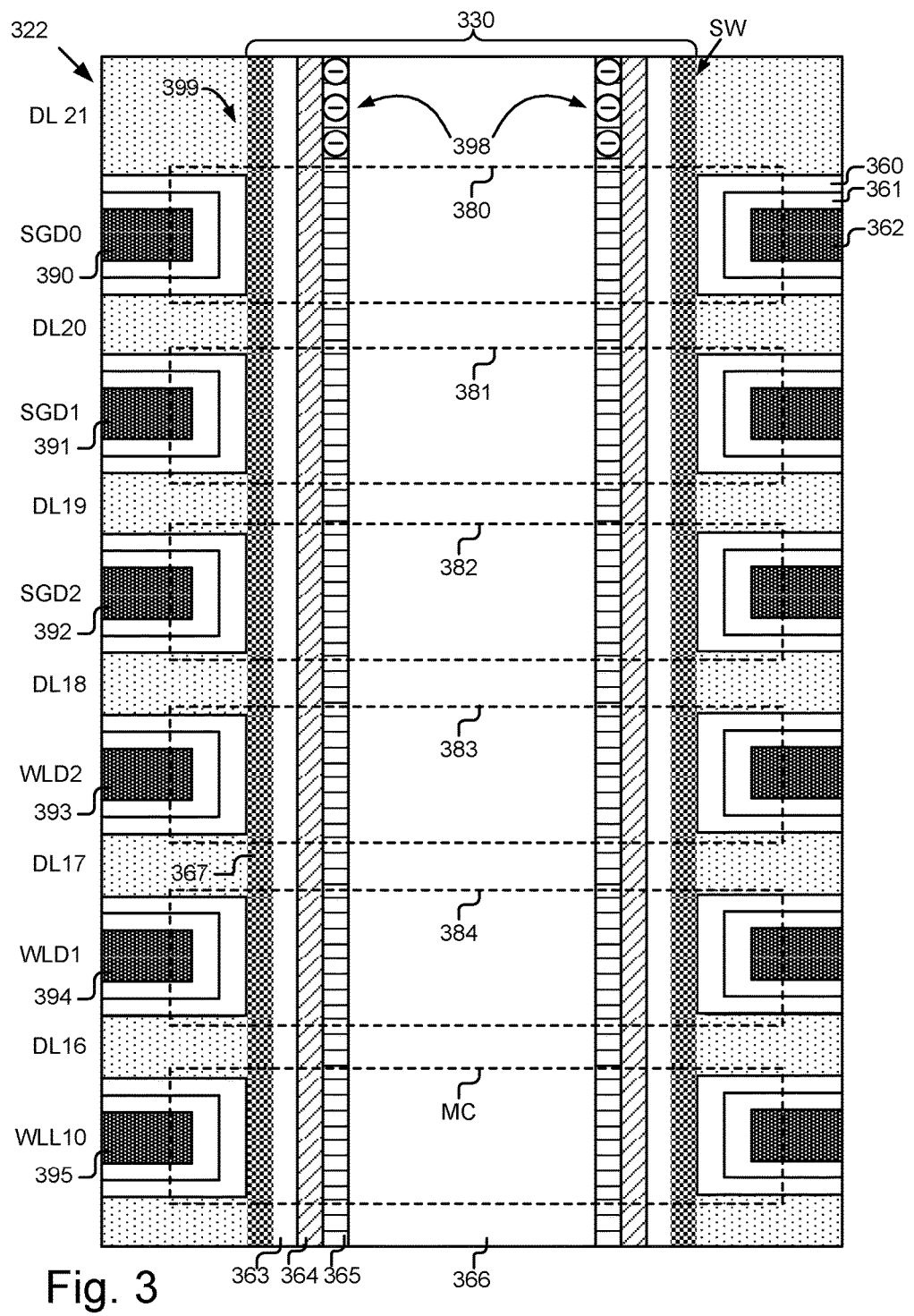
FIG. 3 depicts a close-up view of a region of FIG. 2.

FIG. 3 depicts a close-up view of the region 322 of FIG. 2. Memory cells are formed at the different levels of the stack at the intersection of a word line layer and a memory hole. In this example, SGD transistors 380, 381, and 382 are provided above dummy memory cells 383 and 384 and a data memory cell MC. A number of layers can be deposited along the sidewall (SW) of the memory hole 330 and/or within each word line layer, e.g., using atomic layer deposition. For example, each pillar 399 or column which is formed by the materials within a memory hole 330 can include a blocking oxide 367, a charge-trapping layer 363 or film such as silicon nitride (Si3N4) or other nitride, a tunneling layer 364, a channel 365 (e.g., comprising polysilicon), and a dielectric core 366. A word line layer can include a blocking oxide/block high-k material 360, a metal barrier 361, and a conductive metal 362 such as Tungsten as a control gate. For example, control gates 390, 391, 392, 393, 394, and 395 are provided. In this example, all of the layers except the metal are provided in the memory hole 330. In other approaches, some of the layers can be in the control gate layer. Additional pillars are similarly formed in the different memory holes. The pillar 399 can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

Figure 9:
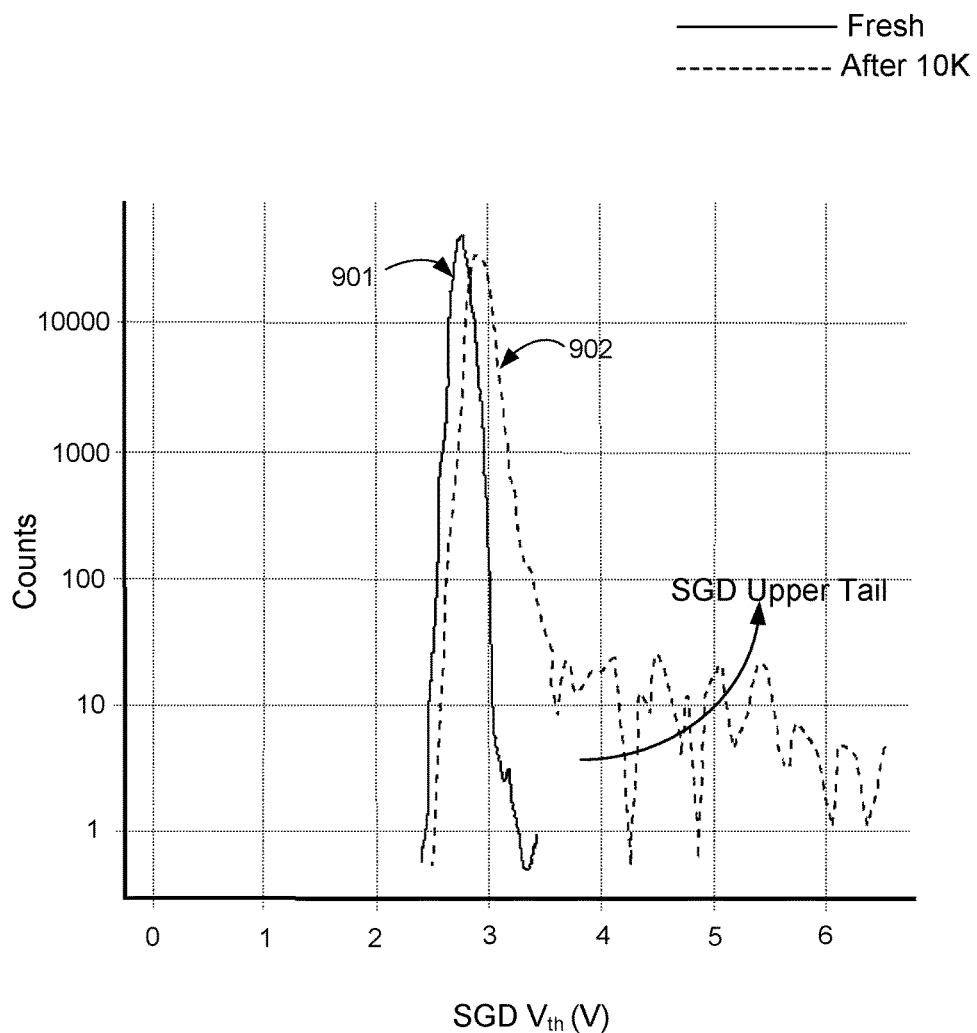
FIG. 9 depicts a threshold voltage distribution plot of a count of SGD transistors versus Vth, for a block of memory cells.

The NAND string can be considered to have a floating body channel because the length of the channel is not formed on a substrate. Further, the NAND string is provided by a plurality of word line layers above one another in a stack and separated from one another by dielectric layer As mentioned at the outset, a channel potential gradient may be formed which causes a disturb of the SGD transistor 380. In particular, electrons 398 can be injected into the charge trapping layer on the drain side of the SGD transistors, e.g., above the transistors in a core height region of the stack. This region may be associated with D21, for instance. Once injected, the electrons cannot be removed by an erase or program operation for the SGD transistors because the portion of the charge trapping layer in which the electrons are injected is not directly adjacent to a control gate layer. This results in an increase in the upper tail of the Vth distribution of the SGD transistors, as shown in FIG. 9. Moreover, the increase in the upper tail becomes worse as program-erase cycles accumulate for a block.

Figure 4:
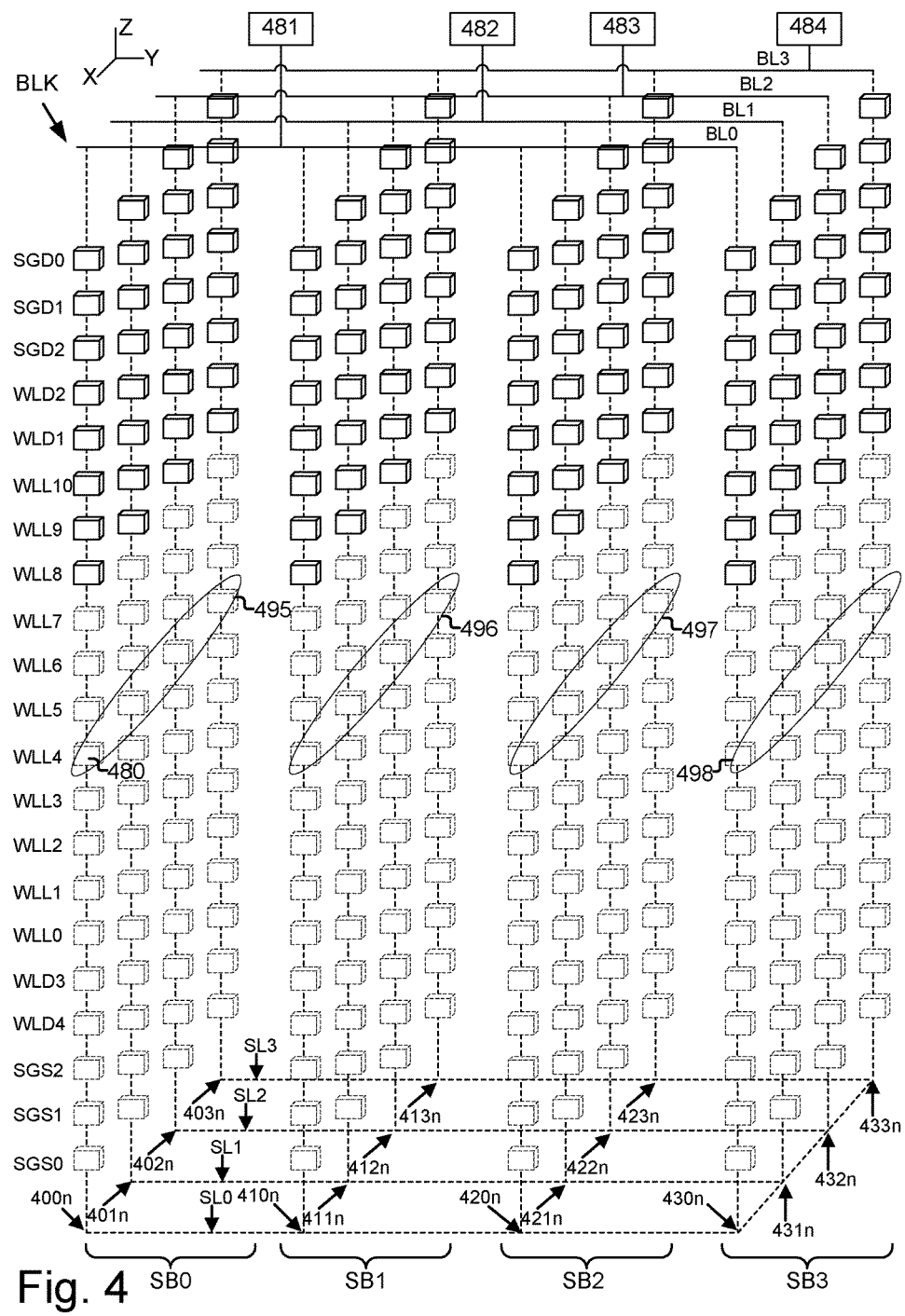
FIG. 4 depicts a further perspective view of the sub-blocks of FIG. 2.

FIG. 4 depicts a further perspective view of the sub-blocks SB0-SB3 of FIG. 2. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell 480 is depicted as a cube for simplicity. SB0 includes NAND strings 400n, 401n, 402n and 403n. SB1 includes NAND strings 410n, 411n, 412n and 413n. SB2 includes NAND strings 420n, 421n, 422n and 423n. SB3 includes NAND strings 430n, 431n, 432n and 433n. Bit lines are connected to sets of NAND strings. For example, a bit line BL0 is connected to NAND strings 400n, 410n, 420n and 430n, a bit line BL1 is connected to NAND strings 401n, 411n, 421n and 431n, a bit line BL2 is connected to NAND strings 402n, 412n, 422n and 432n, and a bit line BL3 is connected to NAND strings 403n, 413n, 423n and 433n. Sensing circuitry may be connected to each bit line. For example, sensing circuitry 481, 482, 483 and 484 are connected to bit lines BL0, BL1, BL2 and BL3, respectively.

The NAND strings are examples of vertical memory strings which extend upward from a substrate.

Programming and reading can occur for selected cells of one word line and one sub-block at a time. This allows each selected cell to be controlled by a respective bit line and/or source line. For example, an example set 495 of memory cells (including an example memory cell 480) in SB0 is connected to WLL4. Similarly, the sets 496, 497 and 498 include data memory cells in SB1, SB2 and SB3 are connected to WLL4. In this example, the source lines SL0-SL3 are connected to one another and driven by a common voltage source.

In another approach, the source lines SL0-SL3 can be separate from one another and driven at respective voltages by separate voltage sources.

FIG. 5 depicts an example memory cell 590. The memory cell 590 includes a control gate CG which receives a word line voltage Vwl, a drain at a voltage Vd, a source at a voltage Vs, and a channel at a voltage Vch.

FIG. 6A depicts an example threshold voltage (Vth) distribution of a set of memory cells in which four data states are used. The set of memory cells may be connected to a common word line. The Vth distribution is obtained after a programming operation. A Vth distribution 600 is provided for erased (Er) state memory cells. Three Vth distributions 601, 602, and 603 represent assigned data states A, B and C, respectively, which are reached by memory cells when their Vth exceeds the erase-verify voltage VvA, VvB or VvC, respectively. In another approach, a single verify voltage is used which is common to the different assigned data states. This example uses four data states. Other numbers of data states can be used as well, such as eight or sixteen. The optimum read voltages generally are midway between the Vth distributions of adjacent data states. Read voltages VrA, VrB and VrC are used to read data from a set of cells having this Vth distribution. Each read voltage demarcates a lower boundary of a data state of a plurality of data states. For example, VrA demarcates a lower boundary of the A state. An erase-verify voltage VvEr is used in an erase-verify test to determine whether the erase operation is completed.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the data state represented by a memory cell is determined. These voltages are demarcation voltages because they demarcate between Vth ranges of different data states.

FIG. 6B depicts an example Vth distribution of a set of memory cells in which eight data states are used. For the Er, A, B, C, D, E, F and G states, we have Vth distributions 620, 621, 622, 623, 624, 625, 626 and 627, respectively. For the Er, A, B, C, D, E, F and G states, we have program-verify voltages VvA, VvB, VvC, VvD, VvE, VvF and VvG, respectively, in one possible approach. In another approach, a single verify voltage is used which is common to the different assigned data states. For the Er, A, B, C, D, E, F and G states, we have read voltages VrA, VrB, VrC, VrD, VrE, VrF and VrG, respectively. An erase-verify voltage VvEr is used during an erase operation.

FIG. 7 depicts a waveform 700 of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 700 includes a series of program voltages 701, 702, 703, 704, 705 . . . 706 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 710) may be applied after each of the program voltages 701 and 702. A-, B- and C-state verify voltages of VvA, VvB and VvC (waveform 711) may be applied after each of the program voltages 703 and 704. After several additional program loops, not shown, E-, F- and G-state verify voltages of VvE, VvF and VvG (waveform 712) may be applied after the final program voltage 706.

Figure 8A:
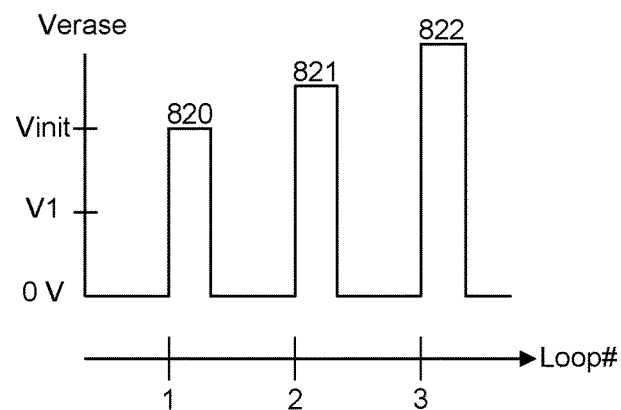
FIG. 8A depicts a plot of erase voltages in an example erase operation.

FIG. 8A depicts a plot of erase voltages in an example erase operation. The erase voltages can be applied to the source end of a set of memory strings via a substrate (CPWELL). When the bit lines float, the erase voltages can be coupled to the drain end of the set of memory strings via the bit lines. The erase voltages can be applied to the substrate via a local interconnect. The vertical axis depicts Verase (VERA) and the horizontal axis depicts the erase loop number. Verase has an initial magnitude of Verase1 and steps up in magnitude in each successive erase loop, e.g., to Verase2, Verase3 and so forth. Three loops are shown as an example. Erase voltages 820, 821 and 822 are applied in the erase loops 1, 2 and 3, respectively. Verase1, Verase2, Verase3 and so forth is the peak voltage applied to the substrate and/or bit line in an erase loop.

Figure 8B:
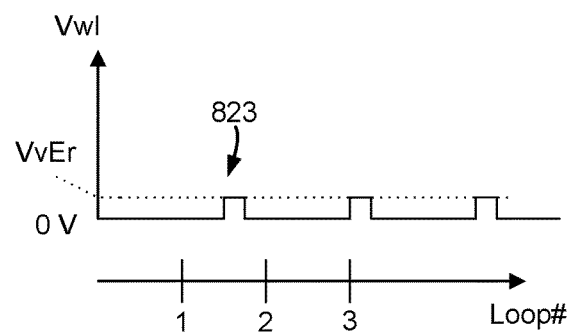
FIG. 8B depicts a plot of erase-verify voltages applied to word lines in a block.

FIG. 8B depicts a plot of erase-verify voltages applied to word lines in a block. The vertical axis depicts Vwl (word line voltage) and the horizontal axis depicts the erase loop number. An example erase-verify voltage 823 is depicted. This voltage (VvEr) may have a magnitude near 0 V, for example. An erase-verify voltage is typically applied after each erase voltage as part of an erase-verify test of a block.

FIG. 9 depicts a threshold voltage distribution plot of a count of SGD transistors versus Vth, for a block of memory cells. For example, the block of memory cells may be 16K bytes in size. The horizontal axis denotes Vth for SGD transistors and the vertical axis denotes the number of SGD transistors. As mentioned, the upper tail of the Vth distribution of the SGD transistors increases due to an SGD disturb. SGD disturb occurs in erase operations and is more severe when the erase voltage is higher. The plot 901 represents the Vth distribution for a fresh block of memory cells. The plot 901 depicts the threshold voltage for the number of SGD transistors is narrowly distributed, within about 2.5 volts to 3.5 volts. The plot 902 represents the Vth distribution for a cycled block of memory cells, for example, after 10,000 cycles. In stacked 3D memory devices, the upper tail increases as program-erase cycles are accumulated, because additional electrons can be injected into the charge trapping layer over time. The increase in the upper tail leads to issues with read and/or program operation. For example, the control of SGD transistors in the upper tail region becomes restrictive because voltages higher than a given threshold (e.g., 4 volts) may be needed to turn on the SGD transistors for a read and/or program operation. Note that when multiple SGD transistors are present in a memory string (e.g., the transistors of SGD0, SGD1, and SGD2 in FIG. 2), the disturb often occurs mainly on the SGD transistor which is closest to the drain end of the memory string (e.g., the transistors of SGD0). A similar problem can occur for the SGS transistors if they have a charge trapping layer.

Figure 10A:
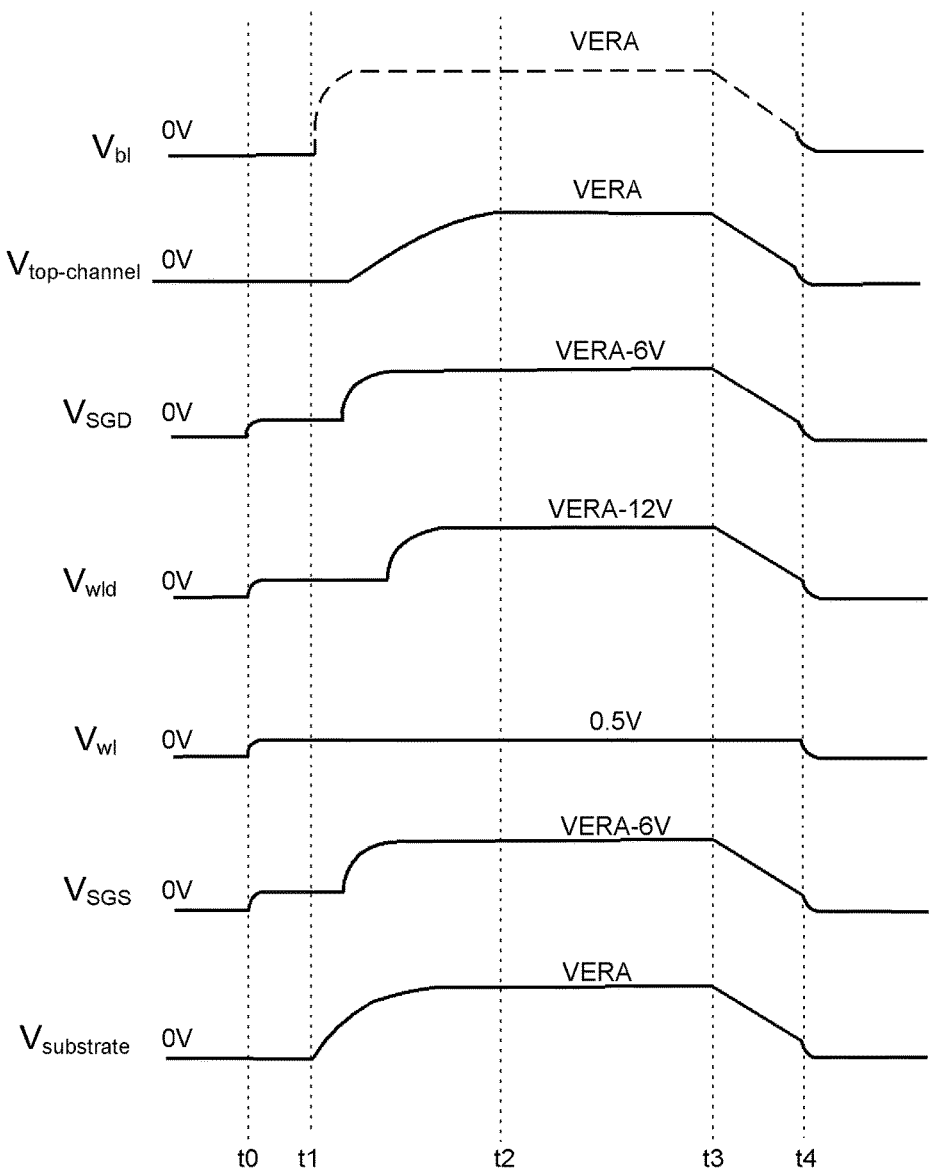
FIG. 10A depicts voltages in an example of a conventional erase operation, where a channel potential gradient is generated between the bit line and the SGD transistors, resulting in electron injection on the drain side of the SGD transistors.

FIG. 10A depicts voltages in an example of a conventional erase operation, where a channel potential gradient is generated between the bit line and the SGD transistors, resulting in electron injection on the drain side of the SGD transistors. The horizontal axis denotes time and the vertical axis denotes voltage. FIG. 10A depicts a bit line voltage (Vbl), a channel voltage (Vtop-channel) near the SGD transistors, a drain side select gate transistor voltage (Vsgd), a dummy word line voltage (Vwld), a data word line voltage (Vwl), a source side select gate transistor voltage (Vsgs), and a substrate voltage (Vsubstrate).

At time t0, the word line voltages are driven to a low level (e.g., 0.5 V) relative to the other depicted voltages. This is a level that is suitable for erasing the memory cells when the channel is charged up. At time t1, Vsubstrate is increased from 0 volts to a positive Verase voltage, VERA (e.g., 20 V or more), which charges up the channel from the bottom of the string to the top through a source line. Specifically, when the SGS transistors are subsequently biased after time t2, such that hole current can flow in to the channel to charge up the channel. Due to the large capacitance of the substrate, Vsubstrate ramps up to VERA at a slow rate. Vtop-channel ramps up to VERA slower than Vsubstrate. This is because Vtop-channel follows Vsubstrate, but with a delay, as the channel voltage near the SGD transistors takes some time to charge up. However, when Vbl is allowed to float (where the dotted line denotes floating) at time t1, Vbl floats up to VERA at a relatively faster rate, before Vsubstrate and Vtop-channel reach VERA. This is because of the metal (M1) composition of the bit line and the capacitive coupling of M1 to the upper metal (M2) layer that is used to supply VERA to the substrate. In this example, immediately after time t1, Vbl is at VERA but Vtop-channel is still close to 0 volts. This results in a significant channel potential gradient between the bit line contact and the SGD transistors, which causes electron injection on the drain side of the SGD transistors.

Figure 10B:
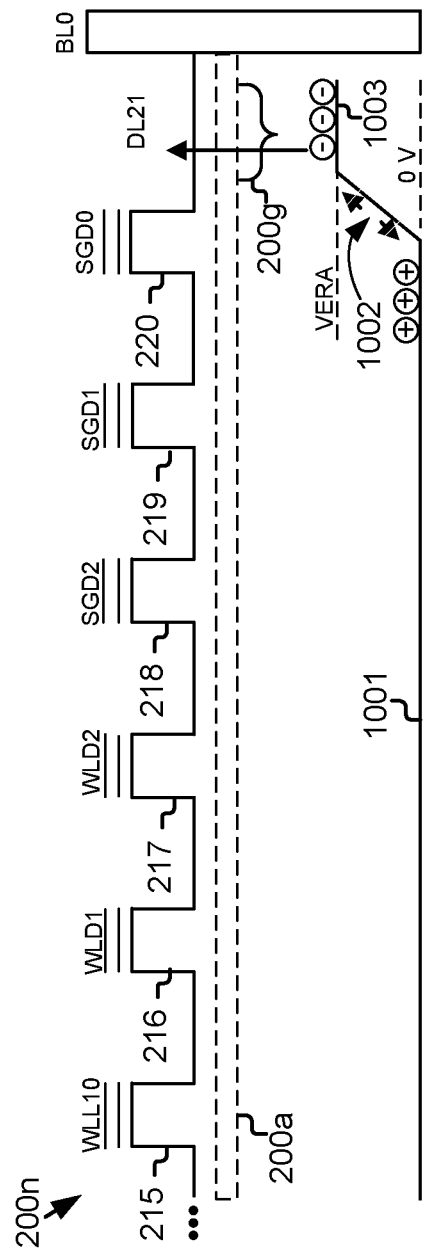
FIG. 10B depicts a plot of a channel voltage versus memory string position during the conventional erase operation of FIG. 10A, showing a channel gradient which injects electrons into a region near an SGD transistor and causes a disturb.

FIG. 10B depicts a plot of a channel voltage versus memory string position during the conventional erase operation of FIG. 10A, showing a channel gradient which injects electrons into a region near an SGD transistor and causes a disturb. A portion of the memory string 200n and its channel 200a of FIG. 2 is depicted. The string 200n includes a data memory cell 215 connected to WLL10, dummy memory cells 216 and 217 connected to WLD1 and WLD2, respectively, and SGD transistors 218, 219, and 220 connected to SGD2, SGD1, and SGD0, respectively. Plots 1001, 1002, and 1003 represent a voltage along the length of the channel. If it is assumed that the erase voltage VERA has just been applied to the substrate and the voltage of the bit line (BL0) is floating, the channel voltage (Vtop-channel) adjacent to the transistors 215-220 will be relatively low (0 V) because it has not yet been fully charged up, and the channel voltage on the drain side of the SGD transistors (see the channel region 200g adjacent to the dielectric layer DL21) will be relatively high (VERA) because it is close to the metal (M1) bit line BL0 which is charged up very quickly.

The channel gradient (VERA-0 V) represented by the plot 1002 generates electron-hole pairs in the channel. The electrons can be accelerated and injected into the charge trapping layer of the channel region 200g, causing a disturb. Example electrons are denoted by "−" and holes are denoted by "+". Eventually, the channel voltage (Vtop-channel) uniformly reaches a charge up level which is close to VERA. The channel 200a is fully charged up at this point so that erasing of the memory cells can occur.

Figure 11:
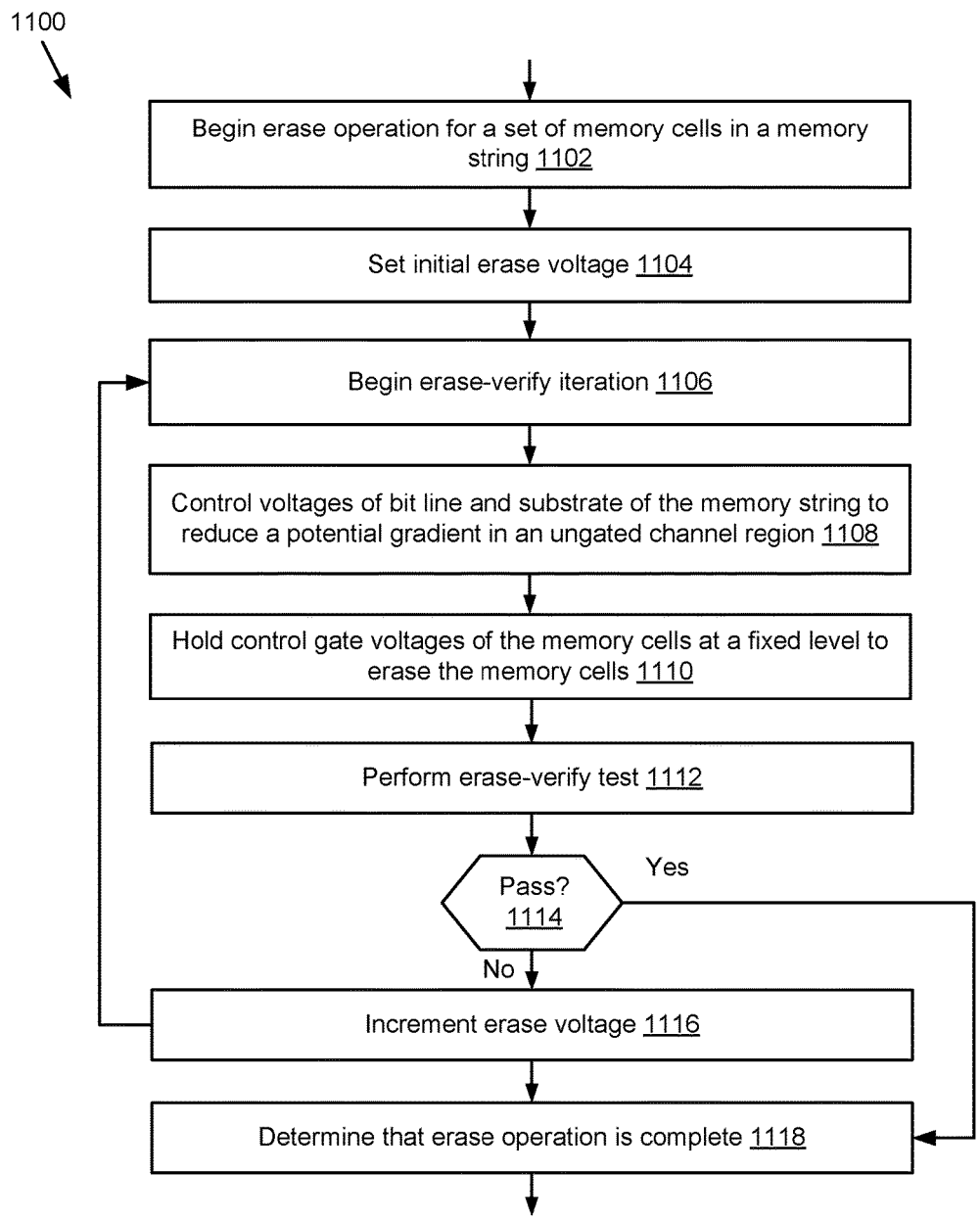
FIG. 11 depicts an example process for performing an erase operation.

FIG. 11 depicts an example process 1100 for performing an erase operation. Step 1102 begins an erase operation for a set of memory cells in a memory string. The erase operation may involve a multiplicity of memory strings in a block, for instance. Step 1104 sets an initial erase voltage (e.g., Verase1 in FIG. 8A). Step 1106 begins an erase-verify iteration. Step 1108 includes controlling voltages of bit line and substrate of the memory string to reduce a potential gradient in an ungated channel region. For example, when a voltage of the channel is charging up, the potential gradient is reduced such that it is less than an erase voltage threshold by raising the voltage of the substrate in relation to a change in the voltage of the bit line. In step 1110, the control circuit may hold the control gate voltages of the memory cells at a fixed level, e.g., 0.5 V, which erases the memory cells. That is, with the channel fully charged up and the word line voltages held at a low level, there is sufficiently large channel-to-gate voltage which erases the memory cells. Step 1112 includes performing an erase-verify test, e.g., using VvEr in FIG. 6A or 6B. A decision step 1114 determines if the verify test is passed. If decision step 1114 is true, the erase operation is completed at step 1118. If decision step 1114 is false, the erase voltage is incremented at step 1116 and a next erase-verify iteration (erase loop) begins at step 1106.

Figure 12A:
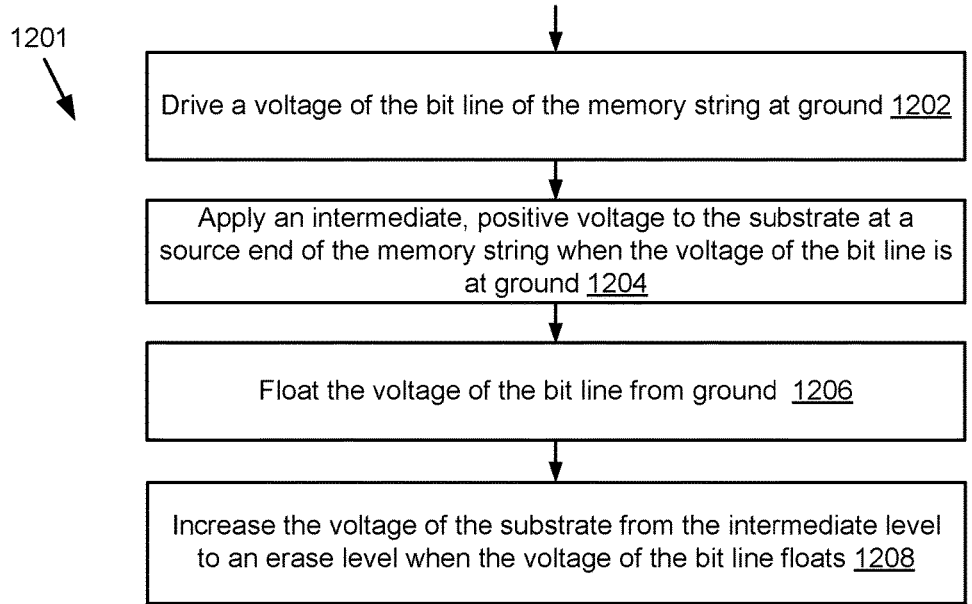
FIG. 12A depicts an example process for reducing a potential gradient in an ungated channel region.

FIG. 12A depicts an example process 1201 for reducing a potential gradient in an ungated channel region, consistent with step 1108 of FIG. 11, where the reducing the potential gradient involves applying an intermediate, positive voltage to the substrate and driving a voltage of the bit line at ground for a specified time period before increasing the voltage of the substrate from the intermediate, positive voltage to an erase voltage threshold and floating the voltage of the bit line. E.g., see FIG. 13. Step 1202 includes driving a voltage of the bit line to a reference voltage (e.g., ground, 0 V, etc.), by connecting the bit line to ground. In further approaches, other reference levels/voltages apart from ground may be used. Step 1204 includes applying an intermediate voltage (e.g., a positive voltage) to the substrate at the source end of the memory string when the voltage of the bit line is at ground. A magnitude of the intermediate voltage may be about 10 to 50 percent of the erase voltage threshold, VERA. In some embodiments, VERA includes a range of about 18 V to 23 V.

Step 1206 includes floating the voltage of the bit line from a reference level (e.g., ground, etc.), for example, by disconnecting the bit line from ground to allow the voltage of the bit line to float. As discussed in connection with FIGS. 10A and 10B, floating the voltage of the bit line causes the voltage of the bit line to couple up to the voltage applied to the substrate due to M1-M2 capacitive coupling. Step 1208 includes increasing the voltage of the substrate from the intermediate level to an erase voltage threshold level, e.g., VERA, when the voltage of the bit line floats. This causes the voltage of the bit line to couple up from the reference level (e.g., ground) to an initial floating voltage level, creating a differential between VERA (e.g., 20 V) and the intermediate voltage level (e.g., 2-10 V) when the ungated channel region is charging up. This advantageously reduces the channel potential gradient between the contact of the bit line and the SGD transistors (to a level less than the erase voltage threshold, VERA). The reduced channel potential gradient beneficially decreases chances of electron injection into the charge trapping layer above the SGD transistors, near DL21, when the VERA is applied to the substrate. E.g., see FIG. 15. Eventually, the voltage of the bit line floats up to VERA from the initial floating voltage level, as discussed further elsewhere herein.

Figure 12B:
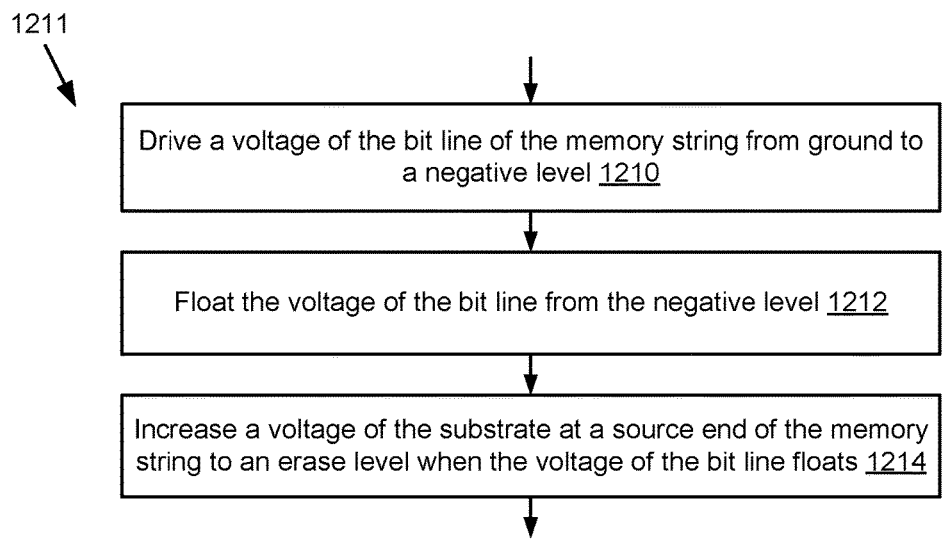
FIG. 12B depicts another example process for reducing a potential gradient in an ungated channel region.

FIG. 12B depicts an example process 1211 for reducing a potential gradient in an ungated channel region, consistent with step 1108 of FIG. 11, where reducing the potential gradient involves driving a voltage of the bit line from ground to a negative level, followed by applying a positive erase voltage threshold to the substrate when the voltage of the bit line floats. E.g., see FIG. 14. Step 1210 includes driving a voltage of the bit line of the memory string from ground to a negative level, e.g., −1 V, −2 V or less. In one approach, a magnitude of the negative voltage level is a percentage of the erase voltage threshold, VERA, e.g., about 5-10 percent of VERA. Step 1212 includes floating the voltage of the bit line from the negative level. As discussed in connection with FIGS. 10A and 10B, floating the voltage of the bit line causes the voltage of the bit line to couple up to the voltage applied to the substrate due to M1-M2 capacitive coupling. Step 1214 includes increasing a voltage of the substrate at a source end of the memory string to an erase level, e.g., VERA, when the voltage of the bit line floats.

By driving the bit line voltage at a negative level instead of the reference level (e.g., 0 V) prior to floating it, the voltage of the bit line beneficially couples up to a relatively smaller voltage (e.g., less than the erase voltage threshold level, VERA) when the ungated channel region is charging up. Increasing the voltage of the substrate to VERA when the voltage of the bit line floats causes the voltage of the bit line to couple up from the negative level to a positive floating voltage level. The differential between VERA (e.g., 20 V) and the negative level (e.g., −2 V) when the ungated channel region is charging up advantageously yields a reduced channel potential gradient between the contact of the bit line and the SGD transistors.

Figure 13:
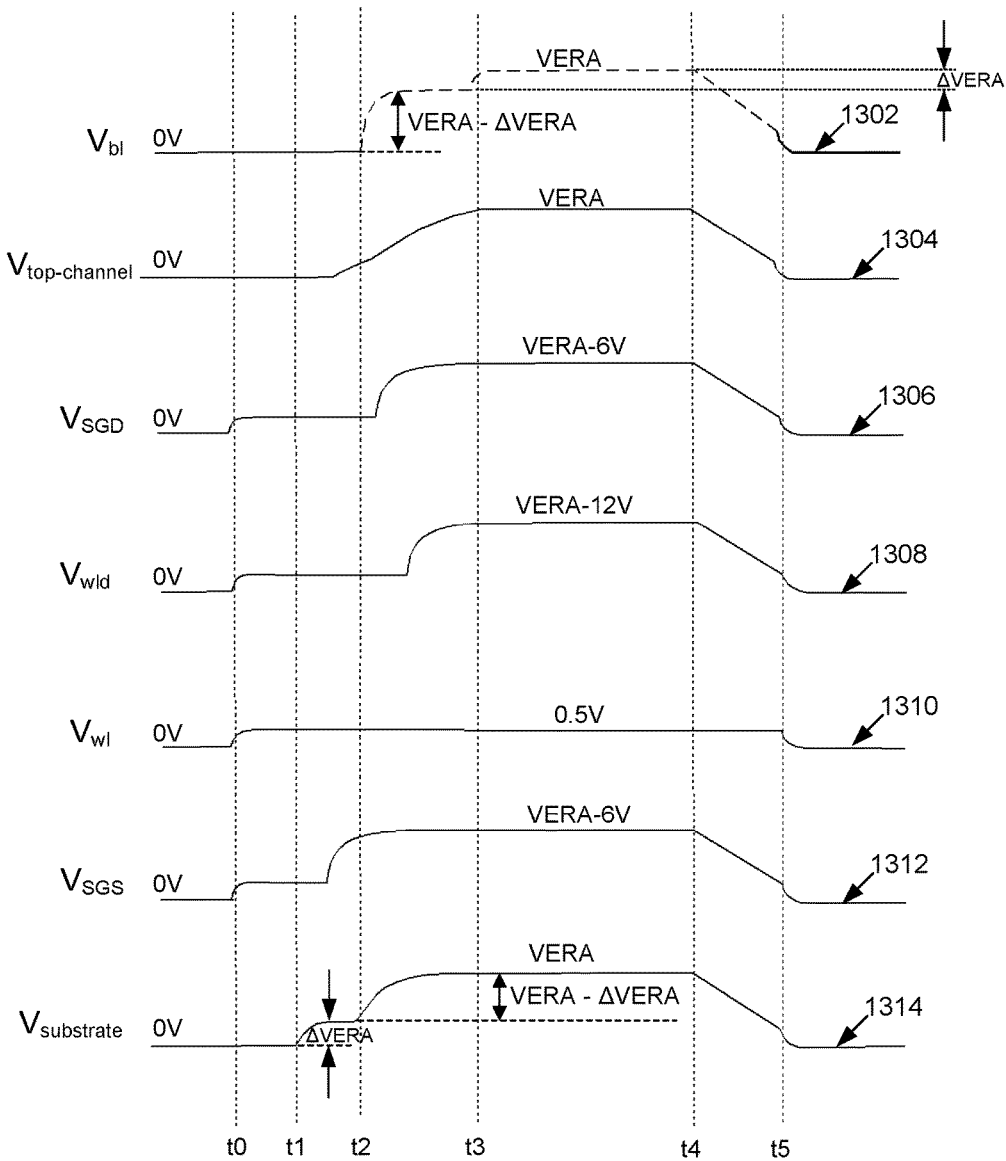
FIG. 13 depicts voltages in an example erase iteration of an erase operation.
Figure 14:
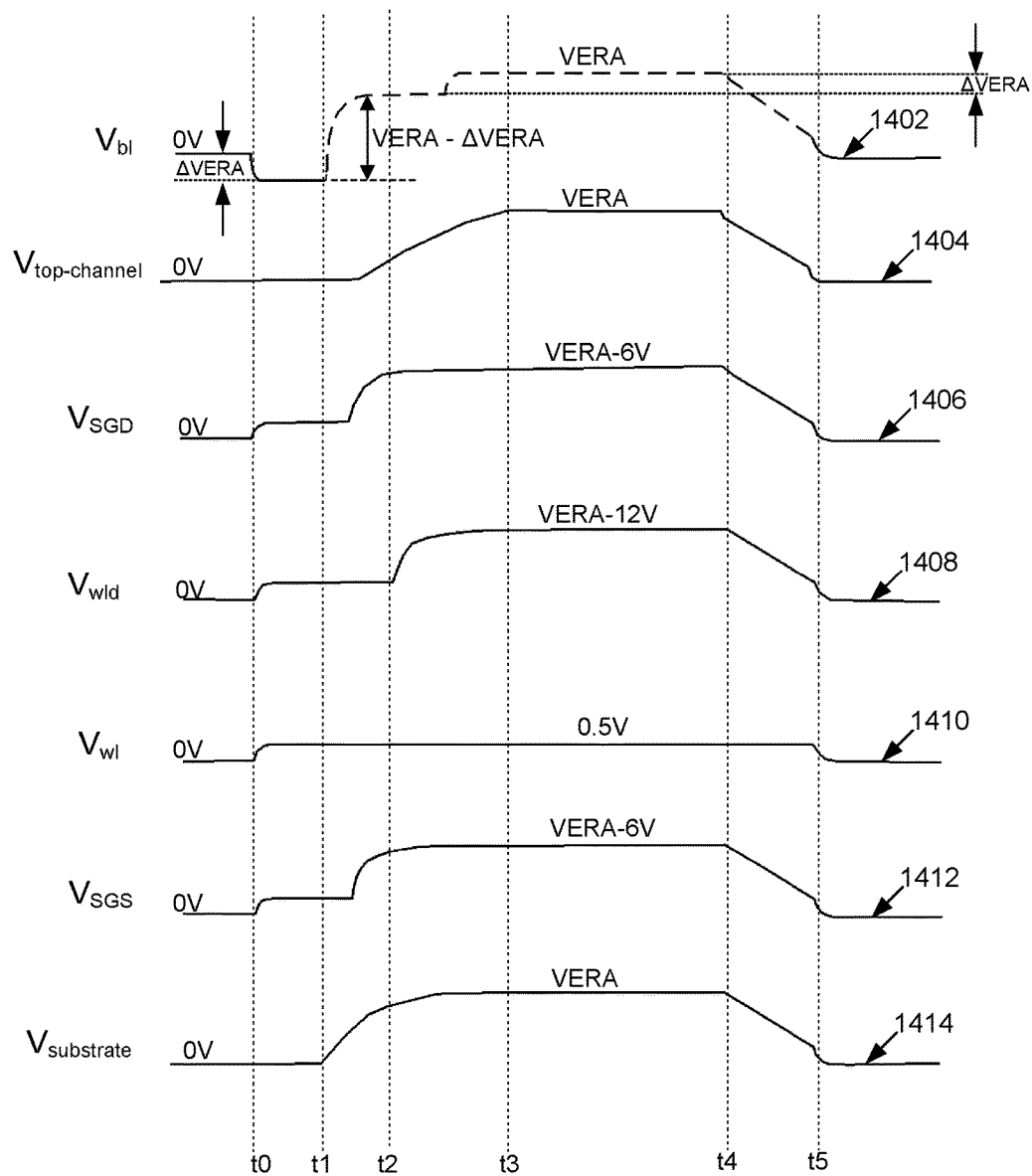
FIG. 14 depicts voltages in another example erase iteration of an erase operation.

FIG. 13 depicts voltages in an example erase iteration of an erase operation, which is consistent with the processes of FIG. 11 and FIG. 12A. In FIGS. 13-14, a dashed line in a portion of a plot indicates that the corresponding voltage is floating and a solid line indicates that the corresponding voltage is driven or fixed voltage. Time points t0, t1 . . . represent increasing time. It should be understood that the time points are not necessarily equally spaced or to scale, and the time points in the different figures do not necessarily correspond. The starting and ending levels of the plots can be 0 V, in one non-limiting example. The correspondence between the plots and voltages is as follows: plot 1302 depicts a voltage of a bit line (Vbl), plot 1304 depicts a voltage of an ungated channel region between the bit line contact and the SGD transistors (Vtop-channel), plot 1306 depicts a drain side select gate voltage (Vsgd), plot 1308 depicts dummy word line voltages (Vwld), plot 1310 depicts data word line voltages (Vwl), plot 1312 depicts a source side select gate voltage (Vsgs), and plot 1314 depicts a substrate voltage (Vsubstrate).

From t0-t2, the control circuit drives Vbl at a reference voltage level, such as 0 V, to delay a floating of Vbl (plot 1302) until Vsubstrate is increased. At t1, the control circuit increases Vsubstrate (plot 1314) from an initial level (e.g., 0 V) to an intermediate level, ΔVERA (e.g., 2-10 V). Subsequently, the control circuit biases Vsgs (plot 1312) at a desired level (e.g., VERA-6 V) when Vsubstrate is at the intermediate level, causing the channel to charge up and increase Vtop-channel (plot 1304). Vtop-channel follows Vsubstrate, but with a delay. As a result, at t2, Vtop-channel increases to a non-zero, positive level (but much less than VERA) when the control circuit increases Vsubstrate from an initial level to an intermediate level and keeps Vbl driven at 0 V.

At t2, the control circuit floats Vbl (e.g., the disconnect circuit 119 disconnects Vbl from ground and does not drive Vbl), while subsequently increasing Vsubstrate from the intermediate level, ΔVERA, to the erase voltage threshold level, VERA (e.g., 20 V). The control circuit subsequently biases Vsgd (plot 1306) at a desired level (e.g., VERA-6 V). This allows Vbl to quickly couple up from 0 V to the initial floating voltage of VERA-ΔVERA (e.g., 10-18 V) applied to Vsubstrate at t2. This is because when Vbl is floated, Vbl instantaneously couples up to a voltage of Vsubstrate due to M1-M2 capacitive coupling at the time of floating. Since Vtop-channel is at a non-zero, positive level and Vbl is coupled up only to VERA-ΔVERA after t2, the channel potential gradient between the bit line contact and the SGD transistors is reduced by about ΔVERA from VERA when Vtop-channel is slowly ramping up to VERA during t2-t3. E.g., see FIG. 15. Therefore, the chance of electron injection on the drain side of the SGD transistors is also reduced during t2-t3 because the potential gradient is maintained below VERA.

At t3, Vbl eventually floats up to VERA from the initial floating voltage of VERA-ΔVERA due to M1-M2 capacitive coupling. Also at t3, Vtop-channel is charged up to VERA. Between t0 and t5, the control circuit drives word line voltages (plot 1310) at a first level such as 0.5 V. This first level is suitable for erasing the memory cells when the channel is charged up to VERA.

In one embodiment, at t2, the control circuit drives Vbl to VERA-ΔVERA when the Vtop-channel is charging up to VERA to maintain the potential gradient between the bit line contact and the SGD transistors below VERA. After Vtop-channel is sufficiently charged up, the control circuit increases Vbl to VERA.

FIG. 14 depicts voltages in another example erase iteration of an erase operation which is consistent with the processes of FIG. 11 and FIG. 12B. The correspondence between the plots and voltages is as follows: plot 1402 depicts a voltage of a bit line (Vbl), plot 1404 depicts a voltage of an ungated channel region between the bit line contact and the SGD transistors (Vtop-channel), plot 1406 depicts a drain side select gate voltage (Vsgd), plot 1408 depicts dummy word line voltages (Vwld), plot 1410 depicts data word line voltages (Vwl), plot 1412 depicts a source side select gate voltage (Vsgs), and plot 1414 depicts a substrate voltage (Vsubstrate).

Prior to t0, the control circuit drives Vbl (plot 1402) at a reference voltage level, such as 0 V. At t0, the control circuit drives Vbl from 0 V to a negative level, ΔVERA (e.g., −1 V, −2 V or less) before floating Vbl. Between t0 and t1, the control circuit drives Vbl at the negative level. At t1, the control circuit increases Vsubstrate (plot 1414) from 0 V to an erase voltage threshold level, VERA (e.g., 20 V). In one embodiment, ΔVERA is about 5-10 percent of VERA. Also, at t1, the control circuit floats Vbl (e.g., bit line is disconnected from a voltage source and not driven), which causes Vbl to quickly couple up from the negative level to a positive, initial floating voltage of VERA-ΔVERA (e.g., 18 V) due to M1-M2 capacitive coupling. In one embodiment, at t1, the control circuit drives Vbl to VERA-ΔVERA when the Vtop-channel is charging up to VERA to maintain the potential gradient between the bit line contact and the SGD transistors below VERA. After Vtop-channel is sufficiently charged up, the control circuit increases Vbl to VERA.

Subsequently after t1, the control circuit biases Vsgs (plot 1412) and Vsgd (plot 1406) at a desired level (e.g., VERA-6 V), which causes the channel to charge up and increase Vtop-channel (plot 1404). Since Vtop-channel is close to 0 V and Vbl is coupled up only to VERA-ΔVERA after t1, the channel potential gradient between the bit line contact and the SGD transistors is reduced by about ΔVERA from VERA when Vtop-channel ramps up gradually to VERA during t1-t2. E.g., see FIG. 15. Therefore, the chance of electron injection on the drain side of the SGD transistors is also reduced during t1-t2. Vbl eventually floats up to VERA from the initial floating voltage of VERA-ΔVERA due to M1-M2 capacitive coupling. At t3, Vtop-channel is charged up to VERA. Between t0 and t5, the control circuit drives word line voltages (plot 1410) at a first level such as 0.5 V. This first level is suitable for erasing the memory cells when the channel is charged up to VERA.

Figure 15:
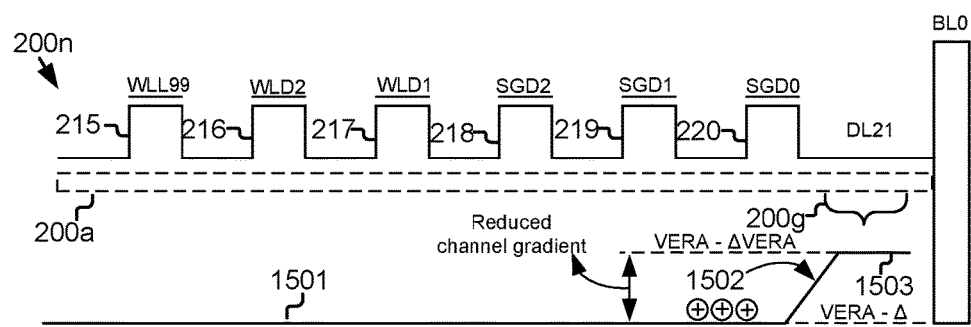
FIG. 15 depicts a plot of a channel voltage versus memory string position during an erase operation, showing a reduced channel gradient.

FIG. 15 depicts a plot of a channel voltage versus memory string position during an erase operation, showing a reduced channel gradient which is consistent with FIGS. 11, 12A, 12B, 13 and 14. A portion of the memory string 200n and its channel 200a of FIG. 2 is depicted. The string 200n includes a data memory cell 215 connected to WLL10, dummy memory cells 216 and 217 connected to WLD1 and WLD2, respectively, and SGD transistors 218, 219, and 220 connected to SGD2, SGD1, and SGD0, respectively. Plots 1501, 1502, and 1503 represent a voltage along the length of the channel. The channel gradient (VERA-ΔVERA) represented by the plot 1502 is reduced from VERA by about ΔVERA. As such, the chances of electrons accelerating, getting injected into the charge trapping layer of the channel region 200g, and causing a disturb is also reduced. Eventually, the channel voltage (Vtop-channel) represented by plot 1501 uniformly reaches a charge up level which is close to VERA. The channel 200a is fully charged up at this point so that erasing of the memory cells can occur.

Figure 16:
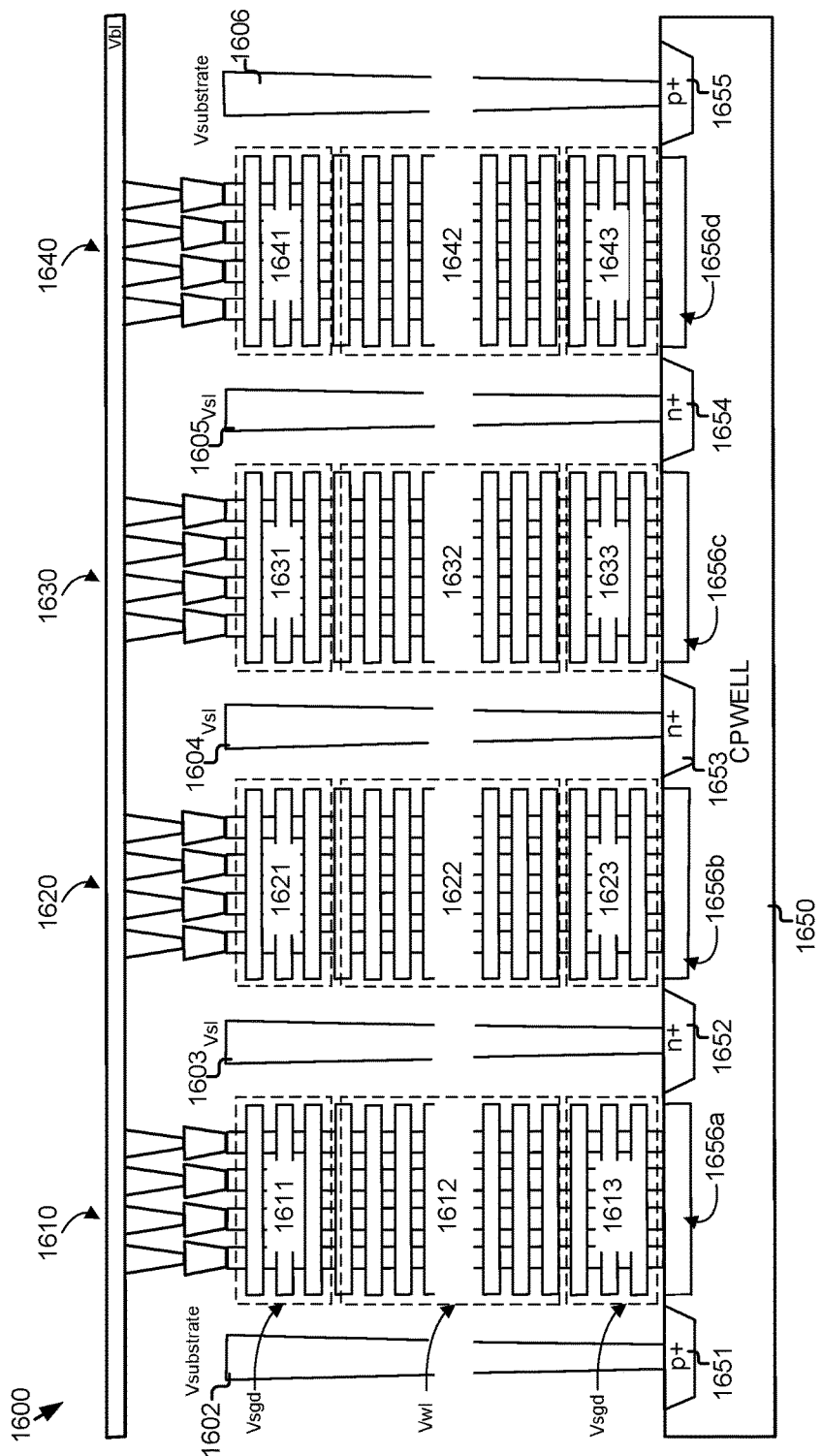
FIG. 16 depicts an example configuration of a memory device during an erase operation.

FIG. 16 depicts an example configuration of a memory device 1600 during an erase operation. The memory device 1600 is arranged in groups 1610, 1620, 1630 and 1640. Each group includes a top portion comprising drain-side select gate transistors and dummy memory cells, a middle portion comprising data-storing word lines and a bottom portion comprising source-side select gate transistors and dummy memory cells. Groups 1610, 1620, 1630 and 1640 include top portions 1611, 1621, 1631 and 1641, respectively, middle portions 1612, 1622, 1632 and 1642, respectively, and bottom portions 1613, 1623, 1633 and 1643, respectively. In this example, group 1610 is selected for erase, so that Vsg is applied to each control gate in the top portion 1611 and bottom portion 1613 and Vwl is applied to each control gate in the middle portion 1612. Groups 1620, 1630 and 1640 are not selected for erase, so that the select gate transistors and dummy memory cells can be in a non-conductive state, with 0 V applied on their control gates, or with floating voltages, for example.

The groups are formed on a CPWELL 1650 of a substrate, where the CPWELL includes p+ regions 1651 and 1655 connected to vias 1602 and 1606, respectively, which receive a voltage Vsubstrate. The CPWELL also includes n+ regions 1652, 1653 and 1654 connected to vias 1603, 1604 and 1605, respectively, which receive a source line voltage Vsl. A top portion 1656 of the CPWELL may be doped n-type to improve cell current. For example, a portion 1656a of the n-type region provide a current path between the source ends of the NAND strings in the group 1610 and the via 1603. Controlling the erase voltage waveform and the bit line waveform as described herein allows the erase operation to be carried out while avoiding electron injection on the drain side of the select gate transistors in the NAND strings.

Figure 17:
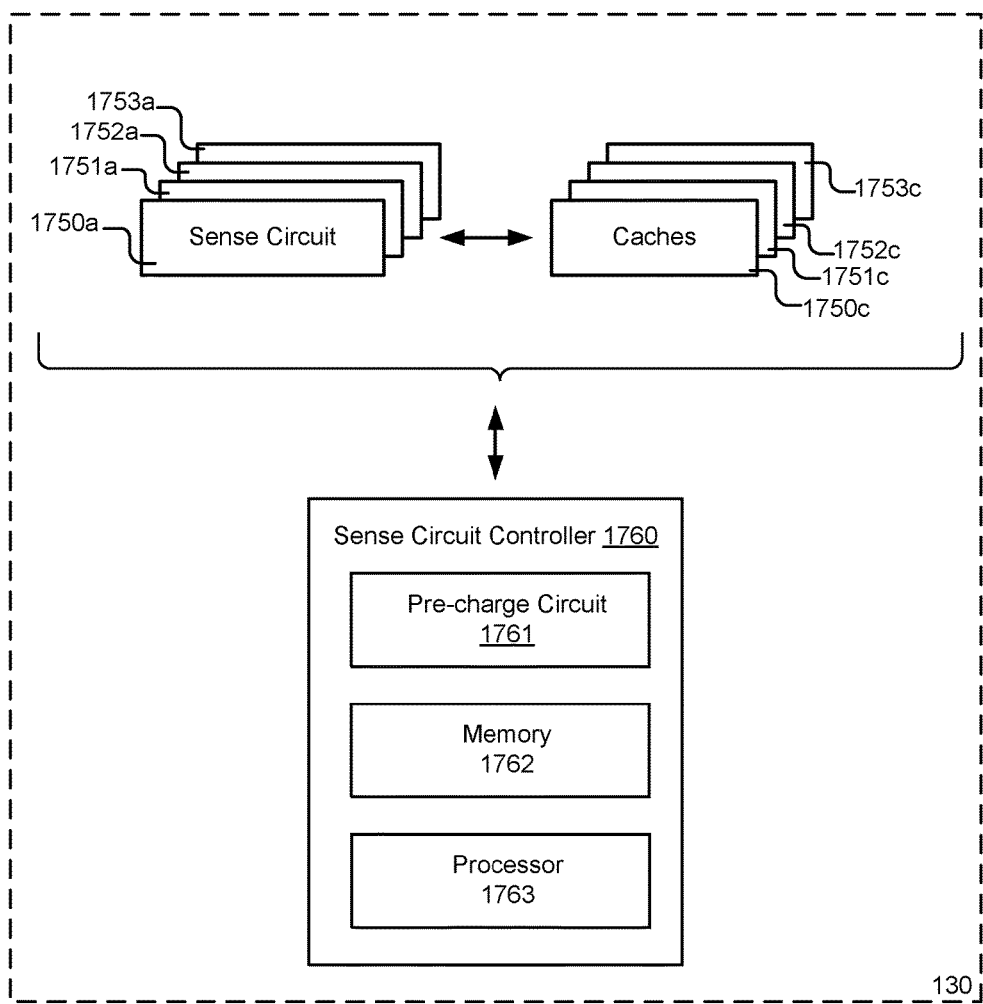
FIG. 17 depicts an example block diagram of a sense block in the column control circuitry of FIG. 1.

FIG. 17 depicts an example block diagram of a sense block 130 in the column control circuitry of FIG. 1. The column control circuitry can include multiple sense blocks, where each sense block performs sensing, e.g., read, program-verify or erase-verify operations for multiple memory cells via respective bit lines.

In one approach, a sense block 130 comprises multiple sense circuits, also referred to as sense amplifiers. Each sense circuit is associated with data latches and caches. For example, the example sense circuits 1750a, 1751a, 1752a and 1753a are associated with caches 1750c, 1751c, 1752c and 1753c, respectively.

In one approach, different subsets of bit lines can be sensed using different respective sense blocks. This allows the processing load which is associated with the sense circuits to be divided up and handled by a respective processor in each sense block. For example, a sense circuit controller 1760 can communicate with the set, e.g., sixteen, of sense circuits and latches. The sense circuit controller may include a pre-charge circuit 1761 which provides a voltage to each sense circuit for setting a pre-charge voltage. The sense circuit controller may also include a memory 1762 and a processor 1763.

Further example details of the sense circuit controller and the sense circuits are provided below.

Figure 18:
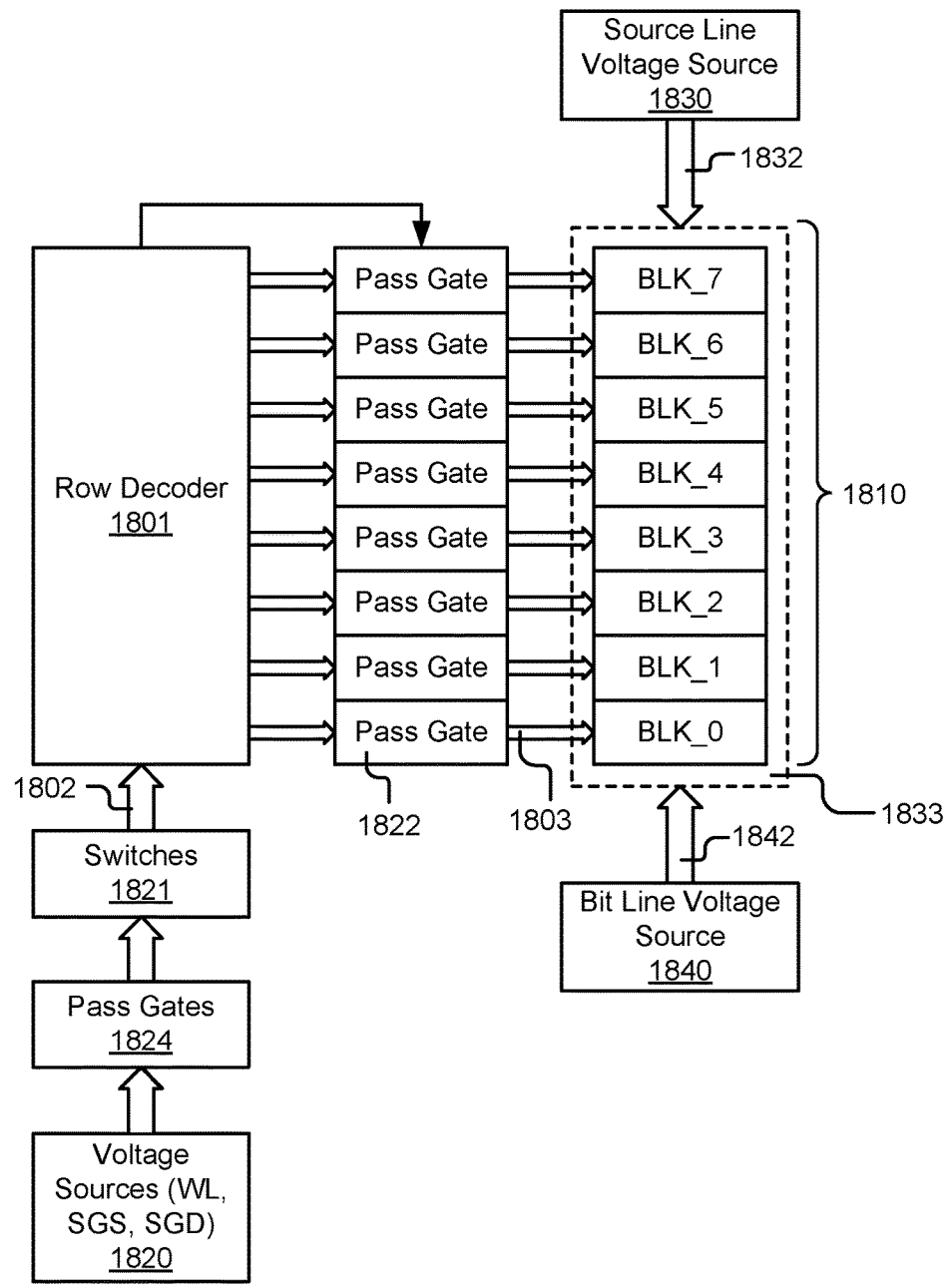
FIG. 18 depicts an example circuit for providing voltages to blocks of memory cells.

FIG. 18 depicts an example circuit for providing voltages to blocks of memory cells. In this example, a row decoder 1801 provides voltages to word lines and select gates of each block in set of blocks 1810. The set could be in a plane and includes blocks BLK0 to BLK7, for instance. The row decoder 1801 provides a control signal to pass gates 1822 which connect the blocks to the row decoder 1801. Typically, operations, e.g., program, read or erase, are performed on one selected block at a time. The row decoder 1801 can connect global control lines 1802 to local control lines 1803. The control lines represent conductive paths. Voltages are provided on the global control lines 1802 from voltage sources 1820. The voltage sources 1820 may provide voltages to switches 1821 which connect to the global control lines 1802. Pass gates 1824, also referred to as pass transistors or transfer transistors, are controlled to pass voltages from the voltage sources 1820 to the switches 1821.

The voltage sources 1820 can provide voltages on data and dummy word lines (WL) and dummy word line portions, SGS layers and SGD layer portions, for example.

The various components, including the row decoder 1801, may receive commands from a controller such as the state machine 112 or the controller 122 to perform the functions described herein.

A source line voltage source 1830 provides a voltage to the source lines/diffusion region in the substrate via control lines 1832. In one approach, the source diffusion region 1833 is common to the blocks. A set of bit lines 1842 is also shared by the blocks. A bit line voltage source 1840 provides voltages to the bit lines. In one possible implementation, the voltage sources 1820 are near the bit line voltage source.

The means described in the present disclosure can include the components of the memory device 100 of FIG. 1 or equivalents thereof, for example. The power control module 116, for instance, controls the power and voltages supplied to the word lines, source lines, select gate lines and bit lines during memory operations. Moreover, the means described above can include the components of FIG. 18 including the decoders, voltage drivers, switches, and pass transistors. The means can further include any of the control circuits in FIG. 1 such as the control circuitry 110 and controller 122.

In various embodiments, the means for driving a voltage can include the power control/program voltage circuit 116 of FIG. 1, the sense circuits of FIG. 17, and the bit line voltage source 1840 of FIG. 18, or other logic hardware, and/or other executable code stored on a computer readable storage medium. Other embodiments may include similar or equivalent means for transmitting data.

In various embodiments, the means for increasing a voltage can include the power control/program voltage circuit 116 of FIG. 1 and the source line voltage source 1830 of FIG. 18, or other logic hardware, and/or executable code stored on a computer readable storage medium. Other embodiments may include similar or equivalent means for transmitting data.

In various embodiments, the means for floating a voltage can include the power control/program voltage circuit 116 including the disconnect circuit 119 of FIG. 1 and the bit line voltage source 1840 of FIG. 18, or other logic hardware, and/or executable code stored on a computer readable storage medium. Other embodiments may include similar or equivalent means for transmitting data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
 a set of memory cells comprising a memory channel, the memory channel comprising a first end electrically coupled to a bit line, a second end electrically coupled to a substrate, and a select gate between the first end and the second end; and
 an erase circuit coupled to the set of memory cells, the erase circuit comprising:
  a bit line driver configured to control a voltage of the bit line; and
  a source line driver configured to raise a voltage of the substrate in relation to a change in the voltage of the bit line controlled by the bit line driver, to charge up the memory channel to an erase voltage threshold such that a channel potential gradient of the memory channel between the bit line and a select gate transistor stays below a predetermined threshold when the memory channel charges up.

2. The apparatus of claim 1, wherein the erase circuit further comprises:
a disconnect circuit configured to disconnect the bit line to float the voltage of the bit line such that the floating voltage of the bit line couples up to the voltage of the substrate, wherein the source line driver is configured to raise the voltage of the substrate to the erase voltage threshold in one or more voltage steps in relation to the floating voltage of the bit line to maintain the channel potential gradient of the memory channel below the predetermined threshold.

3. The apparatus of claim 1, wherein:
the bit line driver is configured to drive the voltage of the bit line up from an initial voltage level in one or more voltage steps toward a voltage level of the substrate; and
the source line driver is configured to raise the voltage level of the substrate in one or more voltage steps in relation to a driving of the voltage of the bit line up from the initial voltage level by the bit line driver.

4. The apparatus of claim 1, wherein:
the bit line driver is configured to drive the voltage of the bit line from a first level to a second level; and
the second level is lower than the first level.

5. The apparatus of claim 4, further comprising:
a disconnect circuit configured to disconnect the bit line to float the voltage of the bit line such that the floating voltage of the bit line couples up to the voltage of the substrate, wherein the source line driver is configured to raise the voltage of the substrate to the erase voltage threshold in one or more voltage steps in relation to the floating voltage of the bit line to maintain the channel potential gradient of the memory channel below the predetermined threshold, wherein:
the source line driver is configured to drive up the voltage of the substrate from a reference voltage level to the erase voltage threshold; and
the disconnect circuit is configured to disconnect the bit line to float the voltage of the bit line from the second level.

6. The apparatus of claim 1, wherein:
the bit line driver is configured to drive the voltage of the bit line at a first level; and
the first level is a reference voltage level.

7. The apparatus of claim 6, further comprising:
a disconnect circuit configured to disconnect the bit line to float the voltage of the bit line such that the floating voltage of the bit line couples up to the voltage of the substrate, wherein the source line driver is configured to raise the voltage of the substrate to the erase voltage threshold in one or more voltage steps in relation to the floating voltage of the bit line to maintain the channel potential gradient of the memory channel below the predetermined threshold, wherein:
the source line driver is configured to drive up the voltage of the substrate from a reference voltage level to an intermediate voltage level at a first time, and to drive up the voltage of the substrate from the intermediate voltage level to the erase voltage threshold at a second time, the second time being later than the first time; and the disconnect circuit is configured to disconnect the bit line to float the voltage of the bit line from the first level at the second time.

8. The apparatus of claim 1, wherein the erase circuit further comprises:
a word line driver configured to hold control gate voltages of the memory cells at a fixed level to erase the memory cells in relation to the charging up of the voltage of the memory channel to the erase voltage threshold.

9. The apparatus of claim 1, wherein the first end is a drain end of the set of memory cells and the second end is a source end of the set of memory cells.

10. An apparatus, comprising:
an erase circuit coupled to a memory string comprising a memory channel, wherein the erase circuit is configured to:
decrease a voltage of a bit line at a drain end of the memory string from a reference voltage level to a negative voltage level;
increase a voltage of a substrate at a source end of the memory string from a reference voltage level up to an intermediate voltage level in a first stage and increase the voltage of the substrate from the intermediate voltage level to an erase voltage threshold in a second stage to charge up the memory channel; and
float the voltage of the bit line such that the floating voltage of the bit line couples up from the negative voltage level to the voltage of the substrate resulting in a potential gradient in an ungated channel region between the bit line and a select gate transistor at the drain end staying below the erase voltage threshold when the memory channel charges up to the erase voltage threshold.

11. The apparatus of claim 10, wherein the erase circuit is configured to increase the voltage of the substrate from the reference voltage level to the erase voltage threshold in the first stage.

12. The apparatus of claim 11, wherein the erase circuit is configured to hold the voltage of the bit line at the reference voltage level and to float the voltage of the bit line from the reference voltage level.

13. A system comprising:
a set of memory cells in a memory string, the memory string comprising a source end and a drain end, the source end connected to a substrate, the drain end connected to a bit line and a select gate transistor, and a channel including an ungated channel region extending between the select gate transistor and the bit line; and
a control circuit coupled to the memory string to reduce a potential gradient in the ungated channel region during an erase operation, wherein the control circuit comprises:
a first voltage supply circuit configured to step down a voltage of the bit line at the drain end from 0 V to a negative voltage level;
a second voltage supply circuit configured to increase a voltage of the substrate at the source end from 0 V to an erase voltage threshold to charge up the channel; and
a disconnect circuit configured to disconnect the bit line in relation to the increase in the voltage of the substrate delivered by the second voltage supply circuit, to float the voltage of the bit line and couple up the floating voltage of the bit line from the negative voltage level to the voltage of the substrate such that the potential gradient in the ungated channel region stays below the erase voltage threshold when the channel charges up to the erase voltage threshold.

14. The system of claim 13, wherein the first voltage supply circuit is configured to step down the voltage of the bit line by about 10 percent of the erase voltage threshold.

15. The system of claim 13, wherein the erase voltage threshold has a range between about 18V and about 23V.

16. The system of claim 13, wherein the disconnect circuit is configured to float the voltage of the bit line such that the floating voltage of the bit line couples up from the negative voltage level to an initial floating voltage level below the erase voltage threshold to reduce the potential gradient in the ungated channel region.

17. The system of claim 16, wherein the disconnect circuit is configured to float the voltage of the bit line such that the floating voltage of the bit line couples up from the initial floating voltage level to the erase voltage threshold.

18. A method comprising:
at a first time, increasing a voltage of a substrate at a source end of a memory string from 0 V to an intermediate voltage level, and at a second time, increasing the voltage of the substrate from the intermediate voltage level to an erase voltage threshold;
charging up a channel of the memory string to the erase voltage threshold for erasing memory cells based on increasing the voltage of the substrate, the memory string comprising the memory cells between the source end and a drain end, the drain end connected to a bit line and a drain of a select gate transistor, the source end connected to the substrate, and an ungated channel region extending between a contact of the bit line and the drain of the select gate transistor;
driving a voltage of the bit line at 0 V; and
at the second time, floating the voltage of the bit line from 0 V to couple the floating voltage of the bit line to the voltage of the substrate, the floating voltage rising to a first voltage level such that a voltage difference in the ungated channel region stays below the erase voltage threshold when the channel charges up.

19. The method of claim 18, wherein a voltage of the intermediate voltage level has a range between about 10 percent and about 50 percent of the erase voltage threshold.

20. The method of claim 18, wherein a value of the first voltage level is a difference between the erase voltage threshold and the intermediate voltage level.

21. An apparatus, comprising:
a memory string comprising a set of memory cells and a memory channel between a source end and a drain end, the drain end connected to a select gate transistor and a bit line, and the source end connected to a substrate;
means for driving a voltage of the bit line at the drain end;
means for increasing a voltage of the substrate at the source end in one or more voltage steps to charge up the memory channel to an erase voltage threshold; and
means for floating the voltage of the bit line in relation to increasing the voltage of the substrate to couple up the floating voltage of the bit line to the voltage of the substrate such that a potential gradient between the bit line and the select gate transistor in the memory channel stays below the erase voltage threshold when the memory channel charges up.

* * * * *